US012699361B2

(12) United States Patent
Ano et al.

(10) Patent No.: US 12,699,361 B2
(45) Date of Patent: Aug. 4, 2026

(54) SUBSTRATE PROCESSING APPARATUS, SUBSTRATE PROCESSING METHOD, TRAINING DATA GENERATION METHOD, TRAINING METHOD, TRAINING DEVICE, TRAINED MODEL CREATION METHOD, AND TRAINED MODEL

(71) Applicant: SCREEN Holdings Co., Ltd., Kyoto (JP)

(72) Inventors: Seiji Ano, Kyoto (JP); Tomonori Kojimaru, Kyoto (JP)

(73) Assignee: SCREEN Holdings Co., Ltd. (JP)

( * ) Notice: Subject to any disclaimer, the term of this patent is extended or adjusted under 35 U.S.C. 154(b) by 871 days.

(21) Appl. No.: 17/921,864

(22) PCT Filed: Mar. 11, 2021

(86) PCT No.: PCT/JP2021/009836
§ 371 (c)(1),
(2) Date: Oct. 27, 2022

(87) PCT Pub. No.: WO2021/220633
PCT Pub. Date: Nov. 4, 2021

(65) Prior Publication Data
US 2023/0161301 A1      May 25, 2023

(30) Foreign Application Priority Data
Apr. 30, 2020    (JP) ................................. 2020-080114

(51) Int. Cl.
*G05B 13/02*        (2006.01)
*G03F 7/42*          (2006.01)
*H10P 70/00*         (2026.01)

(52) U.S. Cl.
CPC ......... *G05B 13/0265* (2013.01); *G03F 7/422* (2013.01); *H10P 70/20* (2026.01)

(58) Field of Classification Search
None
See application file for complete search history.

(56) References Cited

U.S. PATENT DOCUMENTS 6,025,273  A        2/2000  Chen et al.
9,070,636  B2       6/2015  Kamimura
(Continued)

FOREIGN PATENT DOCUMENTS

CN          102968003  A      3/2013
CN          108713239  A      10/2018
(Continued)

*Primary Examiner* — Shamim Ahmed
(74) *Attorney, Agent, or Firm* — OSTROLENK FABER LLP

(57)                ABSTRACT

A substrate processing apparatus includes a substrate holding section, a chemical liquid supply section, a substrate information acquiring section, a chemical liquid processing condition information acquiring section, and a controller. The substrate information acquiring section acquires substrate information including hardened layer thickness information indicating a thickness of a hardened layer in a resist layer of a processing target substrate or ion implantation condition information indicating a condition for ion implantation by which the hardened layer has been formed in the resist layer. The chemical liquid processing condition information acquiring section acquires based on the substrate information chemical liquid processing condition information indicating a chemical liquid processing condition for the processing target substrate from a trained model. The controller controls the substrate holding section and the chemical liquid supply section to perform processing with a chemical liquid on the processing target substrate based on the chemical liquid processing condition information.

8 Claims, 20 Drawing Sheets

(56)          References Cited

U.S. PATENT DOCUMENTS

| | | | |
|---|---|---|---|
| 9,966,282 B2 | 5/2018 | Miyazaki et al. | |
| 11,052,432 B2 | 7/2021 | Hayashi et al. | |
| 11,342,162 B2 | 5/2022 | Sotoku et al. | |
| 2003/0119318 A1* | 6/2003 | Niuya | H01L 21/31133 |
| | | | 257/E21.228 |
| 2012/0073610 A1 | 3/2012 | Kamimura | |
| 2013/0319476 A1 | 12/2013 | Aiura et al. | 134/33 |
| 2014/0007902 A1 | 1/2014 | Brown | |
| 2015/0060406 A1 | 3/2015 | Negoro et al. | 216/83 |
| 2016/0093486 A1 | 3/2016 | Miyazaki et al. | |
| 2019/0043708 A1 | 2/2019 | Sotoku | |
| 2019/0240597 A1 | 8/2019 | Negoro | |
| 2019/0308224 A1 | 10/2019 | Hayashi et al. | |
| 2020/0272057 A1 | 8/2020 | Sotoku et al. | |

FOREIGN PATENT DOCUMENTS

| | | | |
|---|---|---|---|
| GB | 2320335 A | 6/1998 |
| JP | H10135182 A | 5/1998 |
| JP | 2012067254 A | 4/2012 |
| JP | 2012235130 A | 11/2012 |
| JP | 2016072613 A | 5/2016 |
| JP | 2017073467 A | 4/2017 |
| JP | 2019054136 A | 4/2019 |
| JP | 2019176125 A | 10/2019 |

* cited by examiner

LD

| | Substrate information | Chemical liquid processing condition | Processing result |
|---|---|---|---|
| | Hardened layer thickness | | |
| LD1 | Ld1 | Lp1 | GOOD |
| LD2 | Ld2 | Lp2 | POOR |
| LD3 | Ld3 | Lp3 | POOR |
| LD4 | Ld4 | Lp4 | GOOD |
| ⋮ | ⋮ | ⋮ | ⋮ |
| LD1000 | Ld1000 | Lp1000 | GOOD |

LD

| | Substrate information | | Chemical liquid processing condition | Processing result |
|---|---|---|---|---|
| | Hardened layer height | Hardened layer width | | |
| LD1 | Ldt1 | Ldw1 | Lp1 | GOOD |
| LD2 | Ldt2 | Ldw2 | Lp2 | POOR |
| LD3 | Ldt3 | Ldw3 | Lp3 | POOR |
| LD4 | Ldt4 | Ldw4 | Lp4 | GOOD |
| . . . | . . . | . . . | . . . | . . . |
| LD1000 | Ldt1000 | Ldw1000 | Lp1000 | GOOD |

LD

| | Substrate information | Chemical liquid processing condition | | | | | Processing result |
|---|---|---|---|---|---|---|---|
| | Hardened layer thickness | Concen-tration | Temper-ature | Supply amount | Discharge pattern | Rotational speed | |
| LD1 | Ld1 | Lc1 | Lt1 | Ls1 | Le1 | Lv1 | GOOD |
| LD2 | Ld2 | Lc2 | Lt2 | Ls2 | Le2 | Lv2 | POOR |
| LD3 | Ld3 | Lc3 | Lt3 | Ls3 | Le3 | Lv3 | POOR |
| LD4 | Ld4 | Lc4 | Lt4 | Ls4 | Le4 | Lv4 | GOOD |
| ⋮ | ⋮ | ⋮ | ⋮ | ⋮ | ⋮ | ⋮ | ⋮ |
| LD1000 | Ld1000 | Lc1000 | Lt1000 | Ls1000 | Le1000 | Lv1000 | GOOD |

| Chemical liquid processing condition | | | | |
|---|---|---|---|---|
| Concentration | Temperature | Supply amount | Discharge pattern | Rotational speed |
| Rc | Rt | Rs | Re | Rv |

LD

| | Ion implantation condition | | | | Chemical liquid processing condition | Processing result |
|---|---|---|---|---|---|---|
| | Ion species | Acceleration energy | Implantation amount | Implantation direction | | |
| LD1 | Lk1 | La1 | Lu1 | Ld1 | Lp1 | GOOD |
| LD2 | Lk2 | La2 | Lu2 | Ld2 | Lp2 | POOR |
| LD3 | Lk3 | La3 | Lu3 | Ld3 | Lp3 | POOR |
| LD4 | Lk4 | La4 | Lu4 | Ld4 | Lp4 | GOOD |
| . . . | . . . | . . . | . . . | . . . | . . . | . . . |
| LD1000 | Lk1000 | La1000 | Lu1000 | Ld1000 | Lp1000 | GOOD |

LD

| | Substrate information | Chemical liquid processing condition | | | | | Processing result |
| --- | --- | --- | --- | --- | --- | --- | --- |
| | Hardened layer thickness | Concentration profile | Temperature profile | Supply amount | Discharge pattern | Rotational speed | |
| LD1 | Ld1 | Lcp1 | Ltp1 | Ls1 | Le1 | Lv1 | GOOD |
| LD2 | Ld2 | Lcp2 | Ltp2 | Ls2 | Le2 | Lv2 | POOR |
| LD3 | Ld3 | Lcp3 | Ltp3 | Ls3 | Le3 | Lv3 | POOR |
| LD4 | Ld4 | Lcp4 | Ltp4 | Ls4 | Le4 | Lv4 | GOOD |
| . . . | . . . | . . . | . . . | . . . | . . . | . . . | . . . |
| LD1000 | Ld1000 | Lcp1000 | Ltp1000 | Ls1000 | Le1000 | Lv1000 | GOOD |

CT

| | Substrate information | | Chemical liquid processing condition |
| --- | --- | --- | --- |
| | Hardened layer height | Hardened layer width | |
| CT1 | dt1 | dw1 | Rp1 |
| CT2 | dt2 | dw2 | Rp2 |
| CT3 | dt3 | dw3 | Rp3 |
| CT4 | dt4 | dw4 | Rp4 |
| · · · | · · · | · · · | · · · |
| CT1000 | dt1000 | dw1000 | Rp1000 |

FIG. 20

SUBSTRATE PROCESSING APPARATUS, SUBSTRATE PROCESSING METHOD, TRAINING DATA GENERATION METHOD, TRAINING METHOD, TRAINING DEVICE, TRAINED MODEL CREATION METHOD, AND TRAINED MODEL

CROSS-REFERENCE TO RELATED APPLICATIONS

The present application is a 35 U.S.C. §§ 371 national stage application of International Application No. PCT/JP2021/009836, filed Mar. 11, 2021, which claims priority to Japanese Patent Application No. 2020-080114, filed Apr. 30, 2020, the contents of both of which are incorporated herein by reference.

TECHNICAL FIELD

The present invention relates to a substrate processing apparatus, a substrate processing method, a training data generation method, a training method, a training device, trained model creation method, and trained model.

BACKGROUND ART

A substrate processing apparatus for substrate processing is favorably used for semiconductor device production. In substrate production, formation of a resist layer into a specific pattern may be followed by ion implantation on a substrate for modifying a characteristic of the substrate. In that case, the resist layer is peeled off with a chemical liquid after ion implantation. It is known that when ions are implanted into the resist layer in the course of substrate production, a hardened layer or a characteristic-modified layer is formed in the resist layer (see Patent Literature 1).

Patent Literature 1 discloses peeling and removal of the resist layer with a cleaning agent for semiconductor substrate use obtained by adding alkylene carbonate to sulfuric acid and hydrogen peroxide water. According to Patent Literature 1, the cleaning agent for semiconductor substrate use has a cleaning power comparable to that of a SPM cleaning agent and can reduce damage to semiconductor substrates in resist layer peeling.

CITATION LIST

Patent Literature

Patent Literature 1

Japanese Patent Application Laid-Open Publication No. 2012-67254

SUMMARY OF INVENTION

Technical Problem

However, the hardened layer in the resist layer of the substrate may be inappropriately removed by the method disclosed in Patent Literature 1 in some cases. For example, an excessively small amount of the chemical liquid relative to the resist layer subjected to ion implantation leads to insufficient removal of the resist layer. By contrast, an excessively large amount of the chemical liquid relative to the resist layer subjected to ion implantation leads to an increase in cost.

The present invention has been made in view of the foregoing and has its object of providing a substrate processing apparatus, a substrate processing method, a training data generation method, a training method, a training device, a trained model creation method, and a trained model that are capable of appropriately removing the hardened layer in the resist layer of the substrate.

Solution to Problem

According to an aspect of the present invention, a substrate processing device includes: a substrate holding section configured to hold a processing target substrate in a rotatable manner, the processing target substrate including a resist layer with a hardened layer formed therein; a chemical liquid supply section configured to supply a chemical liquid to the processing target substrate; a substrate information acquiring section configured to acquire substrate information of the processing target substrate including hardened layer thickness information of the processing target substrate or ion implantation condition information of the processing target substrate, the hardened layer thickness information of the processing target substrate indicating a thickness of the hardened layer in the processing target substrate, the ion implantation condition information of the processing target substrate indicating a condition for ion implantation by which the hardened layer in the processing target substrate has been formed in the resist layer of the processing target substrate; a chemical liquid processing condition information acquiring section configured to acquire chemical liquid processing condition information of the processing target substrate from a trained model based on the substrate information of the processing target substrate, the chemical liquid processing condition information of the processing target substrate indicating a chemical liquid processing condition of the processing target substrate; and a controller configured to control the substrate holding section and the chemical liquid supply section to perform processing with a chemical liquid on the processing target substrate based on the chemical liquid processing condition information of the processing target substrate acquired in the chemical liquid processing condition information acquiring section. The trained model is built through machine training of training data in which substrate information of a training target substrate including a resist layer with a hardened layer formed therein, chemical liquid processing condition information of the training target substrate, and processing result information of the training target substrate are associated with each other, the substrate information of the training target substrate including hardened layer thickness information indicating a thickness of the hardened layer in the training target substrate or ion implantation condition information indicating a condition for ion implantation by which the hardened layer in the training target substrate has been formed in the resist layer of the training target substrate, the chemical liquid condition information of the training target substrate indicating a condition for the processing with the chemical liquid having been performed on the training target substrate, the processing result information indicating a result of the processing with the chemical liquid having been on the training target substrate.

In an embodiment, the substrate processing device further includes storage that stores the trained model therein.

In an embodiment, the hardened layer thickness information of the processing target substrate contains hardened layer height information indicating a height of the hardened layer in the processing target substrate or hardened layer width information indicating a width of the hardened layer in the processing target substrate, and the hardened layer thickness information of the training target substrate contains hardened layer height information indicating a height of the hardened layer in the training target substrate or hardened layer width information indicating a width of the hardened layer in the training target substrate.

In an embodiment, the chemical liquid processing condition information of the processing target substrate contains information indicating any of a concentration of the chemical liquid, a temperature of the chemical liquid, a supply amount of the chemical liquid, a discharge pattern of the chemical liquid, and a rotational speed of the processing target substrate in supply of the chemical liquid, and the chemical liquid processing condition information of the training target substrate contains information indicating any of the concentration of the chemical liquid, the temperature of the chemical liquid, the supply amount of the chemical liquid, the discharge pattern of the chemical liquid, and a rotational speed of the training target substrate when the chemical liquid has been supplied.

In an embodiment, the information indicating the concentration of the chemical liquid of the processing target substrate indicates a concentration profile in which the concentration of the chemical liquid changes over time, and the information indicating the concentration of the chemical liquid of the training target substrate indicates a concentration profile in which the concentration of the chemical liquid has changed over time.

In an embodiment, the information indicating the temperature of the chemical liquid of the processing target substrate indicates a temperature profile in which the temperature of the chemical liquid changes over time, and the information indicating the temperature of the chemical liquid of the training target substrate indicates a temperature profile in which the temperature of the chemical liquid has changed over time.

According to another aspect of the present invention, a substrate processing method includes: holding a processing target substrate in a rotatable manner, the processing target substrate including a resist layer with a hardened layer formed therein; acquiring substrate information of the processing target substrate including hardened layer thickness information of the processing target substrate or ion implantation condition information of the processing target substrate, the hardened layer thickness information of the processing target substrate indicating a thickness of the hardened layer in the processing target substrate, the ion implantation condition information of the processing target substrate indicating a condition for ion implantation by which the hardened layer in the processing target substrate has been formed in the resist layer of the processing target substrate; acquiring chemical liquid processing condition information of the processing target substrate from a trained model based on the substrate information of the processing target substrate, the chemical liquid processing condition information of the processing target substrate indicating a chemical liquid processing condition of the processing target substrate; and performing processing with a chemical liquid on the processing target substrate according to the chemical liquid processing condition indicated in the chemical liquid processing condition information of the processing target substrate. In the acquiring chemical liquid processing condition information of the processing target substrate, the trained model is built through machine training of training data in which substrate information of a training target substrate including a resist layer with a hardened layer formed therein, chemical liquid processing condition information of the training target substrate, and processing result information of the training target substrate are associated with each other, the substrate information of the training target substrate including hardened layer thickness information indicating a thickness of the hardened layer in the training target substrate or ion implantation condition information indicating a condition for ion implantation by which the hardened layer in the training target substrate has been formed in the resist layer of the training target substrate, the chemical liquid condition information of the training target substrate indicating a condition for the processing with the chemical liquid having been performed on the training target substrate, the processing result information indicating a result of the processing with the chemical liquid having been on the training target substrate.

According to still another aspect of the present invention, a training data generation method includes: acquiring substrate information including hardened layer thickness information or ion implantation condition information from time-series data output from a substrate processing apparatus that processes a training target substrate including a resist layer with a hardened layer formed therein, the hardened layer thickness information indicating a thickness of the hardened layer, the ion implantation condition information indicating a condition for ion implantation by which the hardened layer has been formed in the resist layer; acquiring chemical liquid processing condition information from the time-series data, the chemical liquid processing condition information indicating a condition under which the training target substrate has undergone processing with a chemical liquid in the substrate processing apparatus; acquiring processing result information from the time-series data, the processing result information indicating a result of the processing with the chemical liquid on the training target substrate in the substrate processing apparatus; and storing in storage the substrate information of the training target substrate, the chemical liquid processing condition information of the training target substrate, and the processing result information of the training target substrate in association with each other as training data.

According to a still another aspect of the present invention, a training method includes: acquiring the training data generated according to the training data generation method described above; and performing machine training of the training data by inputting the training data to a training program.

According to a still another aspect of the present invention, a training device includes: storage that stores therein the training data generated according to the training data generation method described above; and a training section configured to perform machine training of the training data by inputting the training data to a training program.

According to a still another aspect of the present invention, a trained model generating method includes: acquiring the training data generated according to the training data generation method described above; and creating a trained model built through machine training of the training data.

According to a still another aspect of the present invention, a trained model is built through machine training of the training data generated according to the training data generation method described above.

According to a still another aspect of the present invention, a substrate processing apparatus includes: a substrate holding section configured to hold a substrate in a rotatable manner, the substrate including a resist layer with a hardened layer formed therein; a chemical liquid supply section configured to supply a chemical liquid to the substrate; storage that stores therein a conversion table in which substrate information of substrates and chemical liquid processing condition information of the substrates are associated with each other, the substrate information of the substrates including hardened thickness information of the substrates or ion implantation condition information of the substrates that indicates conditions for ion implantation of the substrates, the chemical liquid processing condition information of the substrates indicating conditions for chemical liquid processing on the substrates; a substrate information acquiring section configured to acquire substrate information of the substrate including hardened layer thickness information of the substrate or ion implantation condition information of the substrate, the hardened layer thickness information of the substrate indicating a thickness of the hardened layer of the substrate, the ion implantation condition information of the substrate indicating a condition for ion implantation by which the hardened layer of the substrate has been formed in the resist layer of the substrate; a chemical liquid processing condition information acquiring section configured to acquire chemical liquid processing condition information of the substrate indicating a chemical liquid processing condition of the substrate using the conversion table based on the substrate information of the substrate; and a controller configured to control the substrate holding section and the chemical liquid supply section to perform processing with a chemical liquid on the substrate based on the chemical liquid processing condition information of the substrate acquired in the chemical liquid processing condition information acquiring section.

Advantageous Effects of Invention

According to the present invention, the hardened layer in the resist layer of the processing target substrate can be appropriately removed.

BRIEF DESCRIPTION OF DRAWINGS

FIG. 5B is a flowchart depicting chemical liquid processing in the substrate processing method of the embodiment.

FIG. 15B is a diagram of a chemical liquid processing condition acquired based on substrate information.

FIG. 20 is a diagram of a conversion table in a substrate processing apparatus of the embodiment.

DESCRIPTION OF EMBODIMENTS

Figure 1:
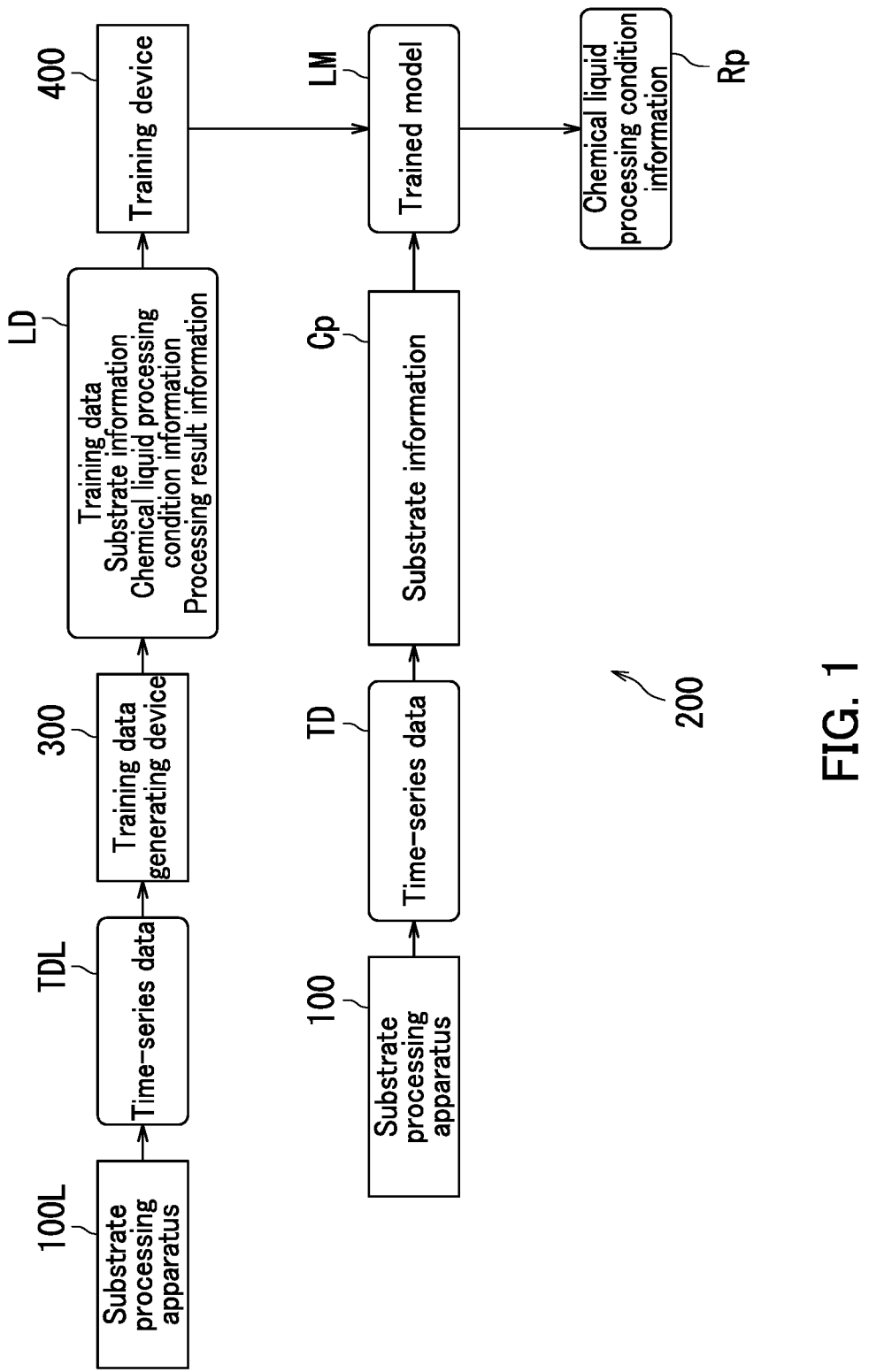
FIG. 1 is a schematic diagram of a substrate processing training system including a substrate processing apparatus of an embodiment.

The following describes an embodiment of a substrate processing apparatus, a substrate processing method, a training data generation method, a training method, a training device, a trained model creation method, and a trained model according to the present invention with reference to the accompanying drawings. Note that elements that are the same or equivalent are indicated by the same reference signs in the drawings and description thereof is not repeated. Also, an X direction, a Y direction, and a Z direction perpendicular to one another may be described for the sake of easy understanding in the present description. Typically, the X direction and the Y direction are parallel to the horizontal direction and the Z direction is parallel to the vertical direction.

First, a substrate processing training system 200 including a substrate processing apparatus 100 of the present embodiment will be described with reference to FIG. 1. The substrate processing training system 200 will be described first with reference to FIG. 1.

FIG. 1 is a schematic diagram of the substrate processing training system 200. As illustrated in FIG. 1, the substrate processing training system 200 includes a substrate processing apparatus 100, a substrate processing apparatus 100L, a training data generating device 300, and a training device 400.

The substrate processing apparatus 100 processes a processing target substrate. Here, the processing target substrate includes a resist layer with a hardened layer formed therein and the substrate processing apparatus 100 that performs processing with a chemical liquid on the resist layer of the processing target substrate. Note that the substrate processing apparatus 100 may perform processing on the processing target substrate besides the chemical liquid processing. The substrate processing apparatus 100 is of a single-wafer type that processes processing target substrates one at a time. Typically, the processing target substrate is substantially disk shaped.

The substrate processing apparatus 100L processes a training target substrate. Here, the training target substrate includes a resist layer with a hardened layer formed therein and the substrate processing apparatus 100L processes the resist layer of the training target substrate with the chemical liquid. Note that the substrate processing apparatus 100L may perform processing on the training target substrate besides the chemical liquid processing. The training target substrate has the same configuration as the processing target substrate. The substrate processing apparatus 100L is of a single-wafer type that processes processing target substrates one at a time. Typically, the processing target substrate is substantially disk shaped. The substrate processing apparatus 100L has the same configuration as the substrate processing apparatus 100. The substrate processing apparatus 100L may be identical to the substrate processing apparatus 100. For example, a single substrate processing apparatus having processed a training target substrate may process a processing target substrate thereafter. Alternatively, the substrate processing apparatus 100L may be another product having the same configuration as that of the substrate processing apparatus 100.

In the following description of the present description, the training target substrate may be referred to as "training target substrate WL" and the processing target substrate may be referred to as "processing target substrate Wp". Also, when it is not necessary to distinguish between the training target substrate WL and the processing target substrate Wp, the training target substrate WL and the processing target substrate Wp may each be referred to as "substrate W".

Examples of the substrates W include a semiconductor wafer, a substrate for liquid crystal display use, a substrate for plasma display use, a substrate for field emission display (FED) use, a substrate for optical disk use, a substrate for magnetic disk use, a substrate for magneto-optical disk use, a substrate for photomask use, a ceramic substrate, and a substrate for solar cell use.

The substrate processing apparatus 100L outputs time-series data TDL. The time-series data TDL is data indicating change in physical quantity over time in the substrate processing apparatus 100L. The time-series data TDL indicates time change in physical quantity (value) that chronologically changes over a predetermined time period. For example, the time-series data TDL is data indicating time change in physical quantity in processing that the substrate processing apparatus 100L has performed on a training target substrate. Alternatively, the time-series data TDL is data indicating time change in physical quantity of a characteristic of a training target substrate processed by the substrate processing apparatus 100L. Alternatively, the time-series data TDL may contain data indicating a production process before a training target substrate is processed by the substrate processing apparatus 100L.

Note that a value indicated in the time-series data TDL may be a value directly measured by a measuring instrument. Alternatively, the value indicated in the time-series data TDL may be a value obtained by arithmetic processing of the value directly measured by the measuring instrument. Alternatively, the value indicated in the time-series data TDL may be a value obtained by arithmetic processing of values measured by a plurality of measuring instruments.

The training data generating device 300 generates training data LD based on the time-series data TDL or at least a portion of the time-series data TDL. The training data generating device 300 outputs the training data LD. The training data LD contains substrate information of a training target substrate WL, chemical liquid processing condition information indicating a processing condition of the chemical liquid processing performed on the training target substrate WL, and processing result information indicating a result of the chemical liquid processing performed on the training target substrate WL. Furthermore, the substrate information of the training target substrate WL contains substrate information of the training target substrate WL measured before the training target substrate WL undergoes the chemical liquid processing.

The training device 400 creates a trained model LM through machine training of the training data LD. The training device 400 outputs the trained model LM.

The substrate processing apparatus 100 outputs time-series data TD. The time-series data TD is data indicating change in physical quantity over time in the substrate processing apparatus 100. The time-series data TDL indicates time change in physical quantity (value) that chronologically changes over the predetermined time period. For example, the time-series data TD is data indicating time change in physical quantity in processing that the substrate processing apparatus 100 has performed on a processing target substrate. Alternatively, the time-series data TD is data indicating time change in physical quantity of the characteristic of a processing target substrate processed by the substrate processing apparatus 100.

Note that a value indicated in the time-series data TD may be a value directly measured by a measuring instrument. Alternatively, the value indicated in the time-series data TD may be a value obtained by arithmetic processing of the value directly measured by the measuring instrument. Alternatively, the value indicated in the time-series data TD may be a value obtained by arithmetic processing of values measured by a plurality of measuring instruments. Alternatively, the time-series data TD may contain data indicating a production process before a processing target substrate is processed by the substrate processing apparatus 100.

An object used by the substrate processing apparatus 100 corresponds to an object used by the substrate processing apparatus 100L. As such, the object used by the substrate processing apparatus 100 has the same configuration as the object used by the substrate processing apparatus 100L. Furthermore, a physical quantity of the object used by the substrate processing apparatus 100 in the time-series data TD corresponds to a physical quantity of the object used by the substrate processing apparatus 100L. As such, the physical quantity of the object used by the substrate processing apparatus 100L is the same as the physical quantity of the object use by the substrate processing apparatus 100.

Substrate information Cp of a processing target substrate Wp is generated from the time-series data TD. The substrate information Cp of the processing target substrate Wp corresponds to the substrate information of the training target substrate WL. The substrate information Cp of the processing target substrate Wp contains substrate information of the processing target substrate Wp. The substrate information of the processing target substrate Wp may be information obtained by measuring the processing target substrate Wp before the processing target substrate Wp undergoes the chemical liquid processing. Alternatively, the substrate information of the processing target substrate Wp may be information about processing performed on the processing target substrate Wp before the chemical liquid processing.

Chemical liquid processing condition information Rp is output from the trained model LM based on the substrate information Cp of the processing target substrate Wp. The chemical liquid processing condition information Rp indicates a chemical liquid processing condition suitable for the processing target substrate Wp in the substrate processing apparatus 100.

According to the present embodiment, the training device 400 performs machine training as has been described so far with reference to FIG. 1. As such, a highly accurate trained model LM can be created from extremely complex time-series data TDL of a huge number of analysis targets. Furthermore, the substrate information Cp from the time-series data TD is input to the trained model LM and the chemical liquid processing condition information Rp indicating a chemical liquid processing condition is output from the trained model LM. As such, the chemical liquid processing can be performed according to the processing target substrate Wp.

Figure 2:
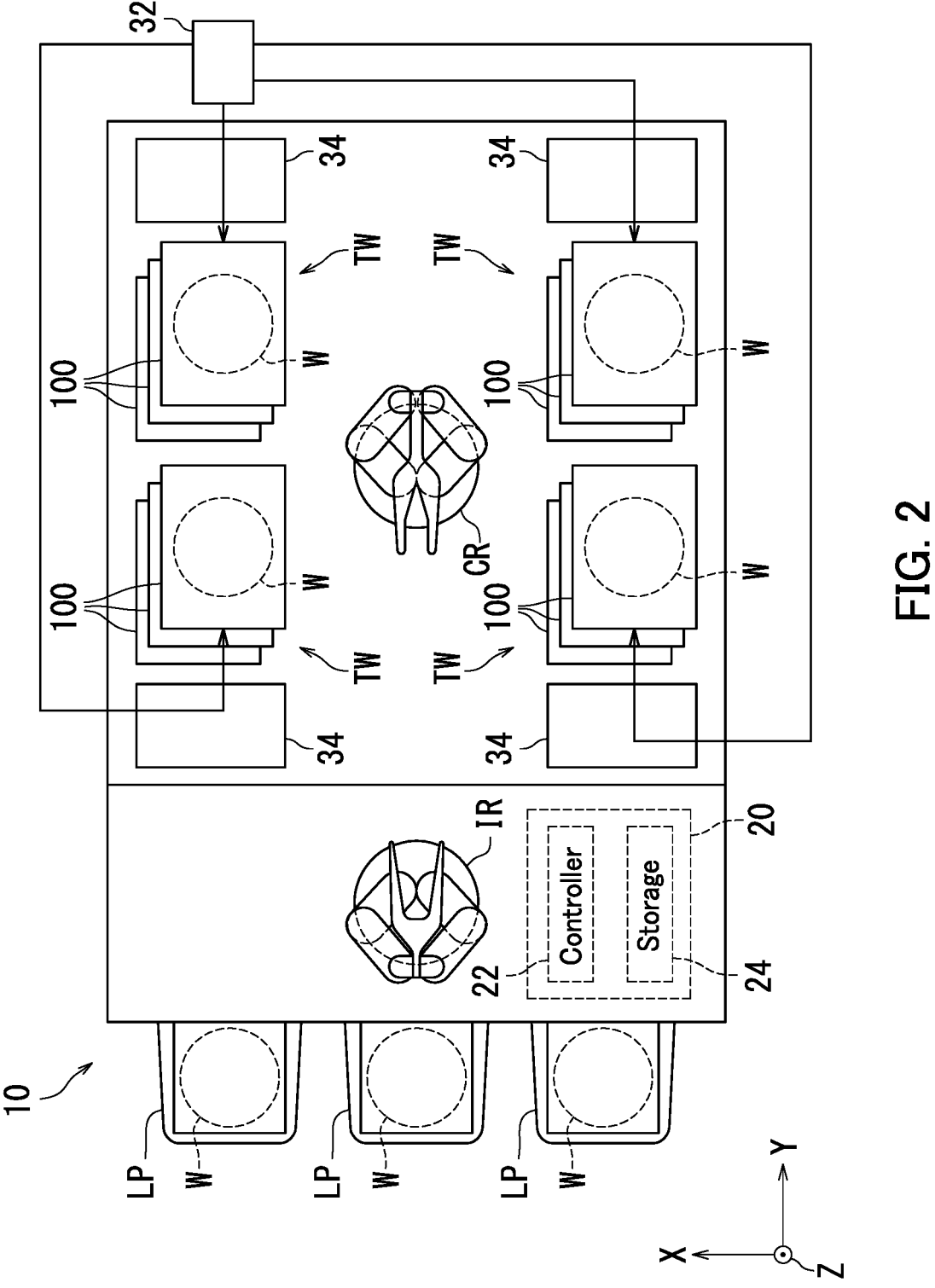
FIG. 2 is a schematic diagram of the substrate processing system including substrate processing apparatuses of the embodiment.

Next, a substrate processing system 10 including substrate processing apparatuses 100 of the present embodiment will be described with reference to FIG. 2. FIG. 2 is a schematic plan view of the substrate processing system 10.

The substrate processing system 10 processes substrates W. The substrate processing system 10 includes a plurality of substrate processing apparatuses 100. The substrate processing apparatuses 100 each process a substrate W in a manner to perform at least one of etching, surface treatment, characteristic assignment, processing film formation, and a combination of removal of at least a part of a film and washing.

As illustrated in FIG. 1, the substrate processing system 10 includes a fluid cabinet 32, fluid boxes 34, a plurality of load ports LP, an indexer robot IR, a center robot CR, and a control device 20 in addition to the substrate processing apparatuses 100. The control device 20 controls the load ports LP, the indexer robot IR, and the center robot CR.

Each of the load ports LP accommodates a plurality of substrates W in a stacked manner. The indexer robot IR transports the substrates W between the load ports LP and the center robot CR. Note that it is possible that a placement table (path) on which the substrates W are temporarily placed is provided between the indexer robot IR and the center robot CR to provide an apparatus configuration by which each substrate W is indirectly delivered between the indexer robot IR and the center robot CR via the placement table. The center robot CR transports the substrates W between the indexer robot IR and the substrate processing apparatuses 100. The substrate processing apparatuses 100 process the substrates W by discharging a liquid toward the substrates W. The liquid includes either or both a chemical liquid and a rinse liquid. Alternatively, the liquid may include another processing liquid. The fluid cabinet 32 accommodates the liquid. Note that the fluid cabinet 32 may accommodate air.

Specifically, the substrate processing apparatuses 100 form a plurality of towers TW (four towers TW in FIG. 2) arranged so as to surround the center robot CR in a plan view. Each of the towers TW includes a plurality of substrate processing apparatuses 100 (three substrate processing apparatuses 100 in FIG. 1) stacked in the vertical direction. The fluid boxes 34 correspond to the respective towers TW. The liquid in the fluid cabinet 32 is supplied to all the substrate processing apparatuses 100 included in the towers TW, each of which corresponds to one of the fluid boxes 34, via the fluid box 34. Furthermore, the air in the fluid cabinet 32 is supplied to all the substrate processing apparatuses 100 included in the towers TW, each of which corresponds to one of the fluid boxes 34, via the fluid box 34.

The control device 20 controls various operations of the substrate processing system 10. The control device 20 includes a controller 22 and storage 24. The controller 22 includes a processor. The controller 22 includes a central processing unit (CPU), for example. Alternatively, the controller 22 may include a general purpose computer.

The storage 24 stores data and a computer program therein. The data includes recipe data. The recipe data contains information indicating a plurality of recipes. Each of the recipes defines processing contents and a processing sequence of a substrate W.

The storage 24 includes a main storage device and an auxiliary storage device. The main storage device is semiconductor memory, for example. The auxiliary storage device is either or both semiconductor memory and a hard disk drive, for example. The storage 24 may include a removable medium. The controller 22 executes the computer program stored in the storage 24 to execute substrate processing operation.

The computer program in which procedures are predefined is stored in the storage 24. The substrate processing apparatuses 100 each operate in accordance with the procedures defined in the computer program.

Note that although one control device 20 is provided in the substrate processing system 10 in FIG. 2, the control device 20 may be provided in each of the substrate processing apparatuses 100. However, in a case as above, the substrate processing system 10 is preferably provided with an additional controller for controlling the substrate processing apparatuses 100 and elements other than the substrate processing apparatuses 100.

Figure 3:
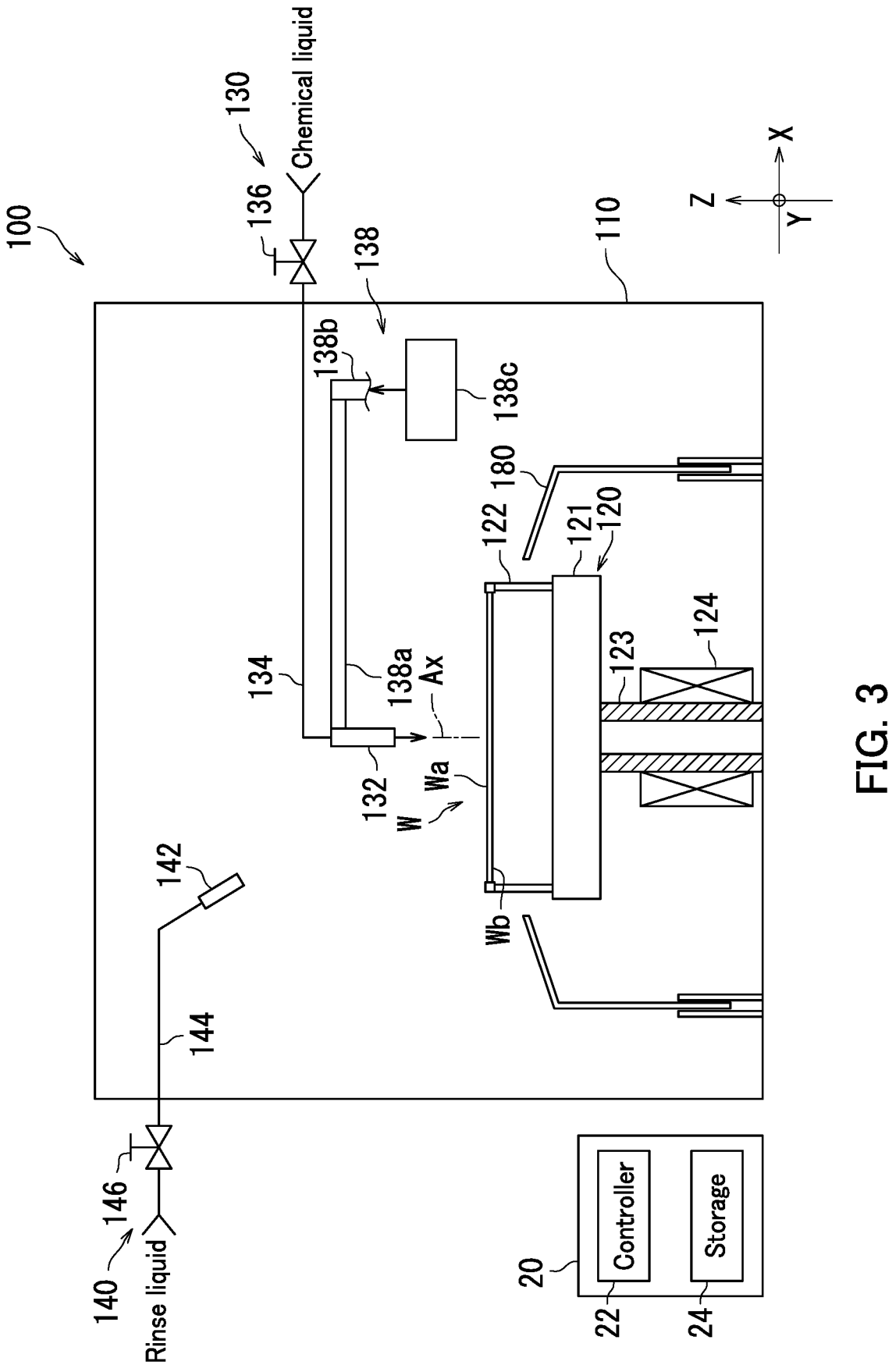
FIG. 3 is a schematic diagram of a substrate processing apparatus of the embodiment.

Next, the substrate processing apparatus 100 of the present embodiment will be described with reference to FIG. 3. FIG. 3 is a schematic diagram of the substrate processing apparatus 100 of the present embodiment. Note that although a configuration of the substrate processing apparatus 100 is described here, the substrate processing apparatus 100L has the same configuration as that of the substrate processing apparatus 100.

The substrate processing apparatus 100 processes a substrate W. The substrate processing apparatus 100 includes a chamber 110, a substrate holding section 120, a chemical liquid supply section 130, and a rinse liquid supply section 140. The chamber 110 accommodates the substrate W. The substrate holding section 120 holds the substrate W. The substrate holding section 120 holds the substrate W in a rotatable manner.

The chamber 110 is substantially box shaped with a hollow therein. The chamber 110 accommodates the substrate W. Here, the substrate processing apparatus 100 is of single-wafer type that processes substrates W one at a time and the substrates W are accommodated one by one in the chamber 110. The substrate W is accommodated inside the chamber 110 and processed inside the chamber 110. At least a part of each of the substrate holding section 120, the chemical liquid supply section 130, and the rinse liquid supply section 140 is accommodated in the chamber 110.

The substrate holding section 120 holds the substrate W. The substrate holding section 120 holds the substrate W in a horizontal posture so that an upper surface Wa of the substrate W faces upward while a reverse surface (lower surface) Wb of the substrate W faces vertically downward. Furthermore, the substrate holding section 120 rotates the substrate W while holding the substrate W.

For example, the substrate holding section 120 may be of pinching type by which the end of the substrate W is pinched. Alternatively, the substrate holding section 120 may have an optional mechanism for holding the substrate W from the reverse surface Wb. For example, the substrate holding section 120 may be of vacuum type. In this case, the substrate holding section 120 holds the substrate W in a horizontal posture by sucking the central part of the reverse surface Wb, which is a non-device-forming surface, of the substrate W to the upper surface of the substrate holding section 120. Alternatively, the substrate holding section 120 may be a combinational type of the pinching type and the vacuum type that makes a plurality of chuck pins in contact with the circumferential end surface of the substrate W.

For example, the substrate holding section 120 includes a spin base 121, a chuck member 122, a shaft 123, and an electric motor 124. The chuck member 122 is provided at the spin base 121. The chuck member 122 chucks the substrate W. Typically, the spin base 121 is provided with a plurality of chuck members 122.

The shaft 123 is a hollow shaft. The shaft 123 extends in the vertical direction along a rotational axis Ax thereof. The shaft 123 has an upper end to which the spin base 121 is connected. The reverse surface of the substrate W is in contact with the spin base 121. The substrate W is placed above the spin base 121.

The spin base 121 is disk shaped and supports the substrate W in a horizontal posture. The shaft 123 extends downward from the central part of the spin base 121. The electric motor 124 provides rotational force to the shaft 123. The electric motor 124 rotates the shaft 123 in a rotational direction to rotate the substrate W and the spin base 121 about the rotational axis Ax as a center. Here, the rotational direction is an anticlockwise direction.

The chemical liquid supply section 130 supplies the chemical liquid to the substrate W. Through the above, the substrate W is processed with the chemical liquid.

For example, the chemical liquid contains hydrofluoric acid (hydrofluoric water (HF)). Alternatively, the chemical liquid may be a liquid containing at least one of sulfuric acid, acetic acid, nitric acid, hydrochloric acid, citric acid, buffered hydrofluoric acid (BHF), dilute hydrofluoric acid (DHF), ammonia water, dilute ammonia water, hydrogen peroxide water, organic alkali (e.g., tetramethyl ammonium hydroxide (TMAH)), a surfactant, and a corrosion inhibitor. Alternatively, the chemical liquid may be a mixed liquid obtained by mixing any of the above liquids. For example, examples of a chemical liquid obtained by mixing these include a sulfuric acid-hydrogen peroxide mixture (SPM), a mixed liquid (SC1) of ammonium hydrogen peroxide mixture, and a mixed liquid (SC2) of hydrochloric acid hydrogen peroxide.

The chemical liquid supply section 130 includes a nozzle 132, a pipe 134, and a valve 136. The nozzle 132 is directed to the upper surface Wa of the substrate W and discharges the chemical liquid toward the upper surface Wa of the substrate W. The pipe 134 is connected to the nozzle 132. The nozzle 132 is provided at the tip end of the pipe 134. The chemical liquid is supplied to the pipe 134 from a supply source. The valve 136 is provided in the pipe 134. The valve 136 opens and closes the flow channel of the pipe 134.

The chemical liquid supply section 130 further includes a nozzle moving section 138. The nozzle moving section 138 moves the nozzle 132 between a discharge point and a retraction point. When the nozzle 132 is located at the discharge point, the nozzle 132 is located above the substrate W. When the nozzle 132 is located at the discharge point, the nozzle 132 discharges the chemical liquid toward the upper surface Wa of the substrate W. When the nozzle 132 is located at the retraction point, the nozzle 132 is located outside the substrate W in the radial direction of the substrate W.

The nozzle moving section 138 includes an arm 138a, a pivot shaft 138b, and a moving mechanism 138c. The arm 138a extends in a substantially horizontal direction. The arm 138a has a tip end on which the nozzle 132 is mounted. The arm 138a is connected to the pivot shaft 138b. The pivot shaft 138b extends in a substantially vertical direction. The moving mechanism 138c turns the pivot shaft 138b about the pivot axis thereof extending in a substantially vertical direction to turn the arm 138a along a substantially horizontal plane. As a result, the nozzle 132 moves along a substantially horizontal plane. For example, the moving mechanism 138c includes an arm swaying motor that turns the pivot shaft 138b about the pivot axis thereof. The arm swaying motor is a servomotor, for example. Furthermore, the moving mechanism 138c moves the pivot shaft 138b up and down in a substantially vertical direction to move up and down the arm 138a. As a result, the nozzle 132 moves in a substantially vertical direction. For example, the moving mechanism 138c includes a ball screw mechanism and an arm raising and lowering motor that provides drive power to the ball screw mechanism. The arm raising and lowering motor is a servomotor, for example.

The rinse liquid supply section 140 supplies a rinse liquid to the substrate W. The rinse liquid may contain any of deionized water (DIW), carbonated water, electrolytic ionized water, ozone water, ammonia water, hydrochloric acid water at a diluted concentration (e.g., about 10 ppm to 100 ppm), and reduced water (hydrogen water).

The rinse liquid supply section 140 includes a nozzle 142, a pipe 144, and a valve 146. The nozzle 142 is directed to the upper surface Wa of the substrate W and discharges the rinse liquid toward the upper surface Wa of the substrate W. The pipe 144 is connected to the nozzle 142. The nozzle 142 is provided at the tip end of the pipe 144. The rinse liquid is supplied to the pipe 144 from a supply source. The valve 146 is provided in the pipe 144. The valve 146 opens and closes the flow channel of the pipe 144.

The substrate processing apparatus 100 further includes a cap 180. The cap 180 collects liquid scattered from the substrate W. The cap 180 ascends vertically to the side of the substrate W. Furthermore, the cap 180 may descend vertically from the side of the substrate W.

The control device 20 controls various operations of the substrate processing device 100. The controller 22 controls any of the substrate holding section 120, the chemical liquid supply section 130, the rinse liquid supply section 140, and the cap 180. In one example, the controller 22 controls any of the electric motor 124, the valves 136 and 146, the moving mechanism 138c, and the cap 180.

The substrate processing apparatus 100 of the present embodiment performs the chemical liquid processing and rinsing processing on the substrate W.

Figure 4:
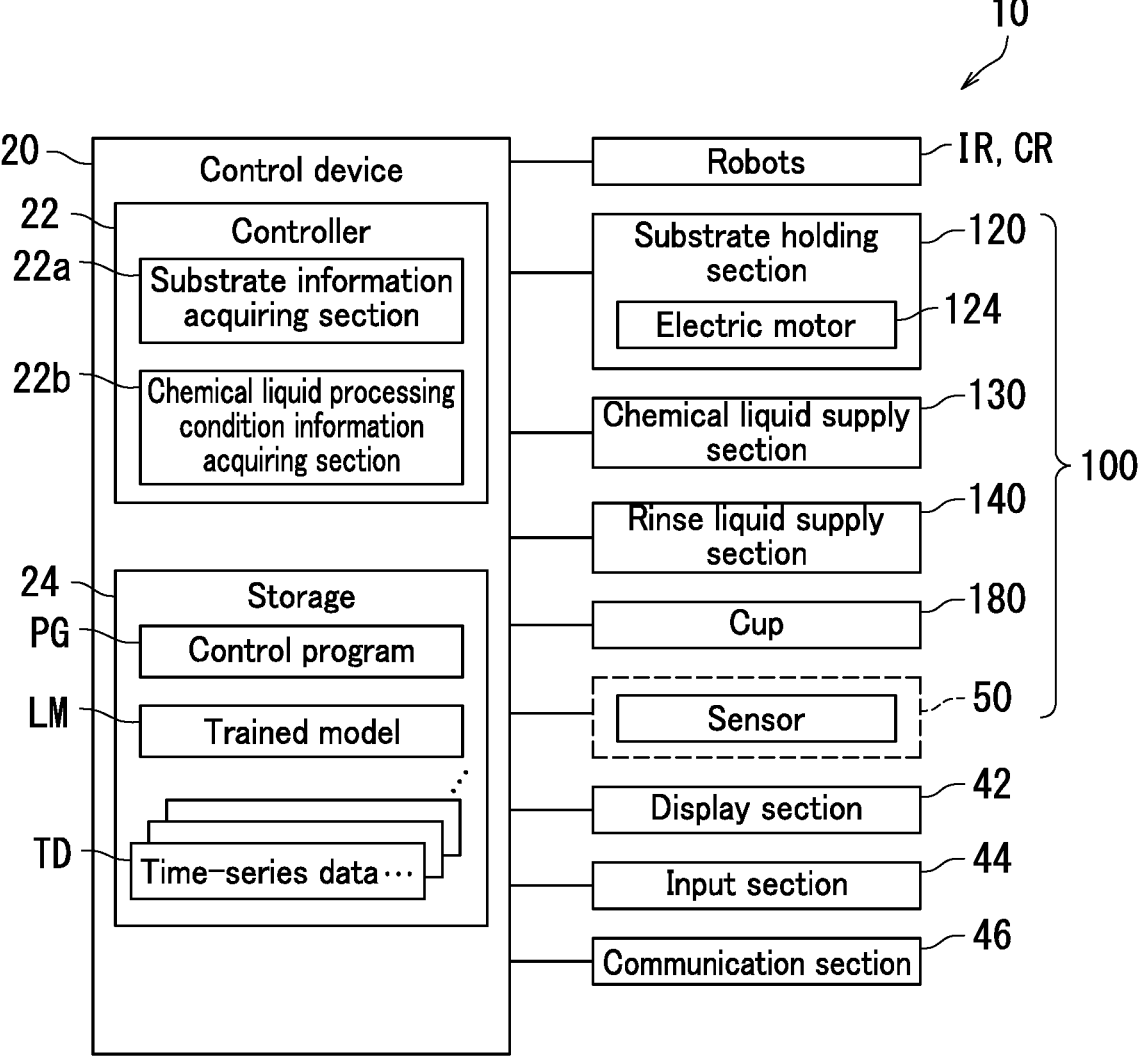
FIG. 4 is a block diagram of a substrate processing system including a substrate processing apparatus of the embodiment.

A substrate processing apparatus 100 of the present embodiment will be described next with reference to FIGS. 1 to 4. FIG. 4 is a block diagram of a substrate processing system 10 including the substrate processing apparatus 100.

As illustrated in FIG. 4, the control device 20 controls various operations of the substrate processing system 10. The control device 20 controls the indexer robot IR, the center robot CR, the substrate holding section 120, the chemical liquid supply section 130, the rinse liquid supply section 140, and the cap 180. In detail, the control device 20 transmits control signals to the indexer robot IR, the center robot CR, the substrate holding section 120, the chemical liquid supply section 130, the rinse liquid supply section 140, and the cap 180 to control the indexer robot IR, the center robot CR, the substrate holding section 120, the chemical liquid supply section 130, the rinse liquid supply section 140, and the cap 180.

Specifically, the controller 22 controls the indexer robot IR to deliver a substrate W.

The controller 22 controls the center robot CR to deliver the substrate W. For example, the center robot CR receives a non-processed substrate W and carries the substrate W into any one of the chambers 110. Also, the center robot CR receives a processed substrate W from the chamber 110 and carries out the substrate W.

The controller 22 controls the substrate holding section 120 to control rotation start of the substrate W, change in rotational speed, and rotation stop of the substrate W. For example, the controller 22 controls the substrate holding section 120 to change the rotational speed of the substrate holding section 120. Specifically, the controller 22 changes the rotational speed of the electric motor 124 of the substrate holding section 120 to change the rotational speed of the substrate W.

The controller 22 controls the valve 136 of the chemical liquid supply section 130 and the valve 146 of the rinse liquid supply section 140 to switch each state of the valves 136 and 146 between the open state and the closed state. Specifically, the controller 22 controls the valves 136 and 146 to set the valves 136 and 146 in the open state, thereby allowing the chemical liquid and the rinse liquid respectively flowing in the pipes 134 and 144 to flow toward the nozzles 132 and 142. Furthermore, the controller 22 controls the valve 136 of the chemical liquid supply section 130 and the valve 146 of the rinse liquid supply section 140 to set the valves 136 and 146 in the closed state, thereby stopping the chemical liquid and the rinse liquid respectively flowing in the pipes 134 and 144 toward the nozzles 132 and 142.

Furthermore, the controller 22 controls the moving mechanism 138*c* to move the arm 138*a* in either or both the horizontal direction and the vertical direction. The controller 22 accordingly moves the nozzle 132 mounted on the tip end of the arm 138*a* above the upper surface Wa of the substrate W. Furthermore, the controller 22 moves the nozzle 132 mounted on the tip end of the arm 138*a* between the discharge point and the retraction point. The substrate processing apparatus 100 of the present embodiment is favorably used for semiconductor device formation.

In the substrate processing apparatus 100 of the present embodiment, the storage 24 stores a trained model LM and a control program PG therein. The substrate processing apparatus 100 operates in accordance with the procedures defined in the computer program PG.

Furthermore, the controller 22 includes a substrate information acquiring section 22*a* and a chemical liquid processing condition information acquiring section 22*b*. The substrate information acquiring section 22*a* acquires substrate information of a processing target substrate Wp. The substrate information of the processing target substrate Wp includes hardened layer thickness information indicating the thickness of a hardened layer in the processing target substrate Wp or ion implantation condition information indicating a condition for ion implantation having been performed on the processing target substrate Wp. Note that the substrate information acquiring section 22*a* may acquire, as the substrate information, information other than the hardened layer thickness information and the ion implantation condition information from the storage 24.

The trained model LM generates chemical liquid processing condition information based on the substrate information. Typically, when the substrate information is input to the trained model LM, chemical liquid processing condition information corresponding to the substrate information is output. In one example, when the hardened layer thickness information or the ion implantation condition information is input to the trained model LM, chemical liquid processing condition information corresponding to the hardened layer thickness information or the ion implantation condition information is output.

The chemical liquid processing condition information acquiring section 22*b* acquires chemical liquid processing condition information from the trained model LM. The chemical liquid processing condition information acquiring section 22*b* acquires the chemical liquid processing condition information corresponding to the substrate information of the processing target substrate Wp from the trained model LM.

The controller 22 controls the substrate holding section 120 and the chemical liquid supply section 130 according to a chemical liquid processing condition indicated in the chemical liquid processing condition information.

Preferably, the substrate processing system 10 further includes a display section 42, an input section 44, and a communication section 46.

The display section 42 displays an image. The display section 42 is a liquid-crystal display or an organic electroluminescent display, for example.

The input section 44 is an input device through which various information is input to the controller 22. For example, the input section 44 is a keyboard, a pointing device, or a touch panel.

The communication section 46 is connected to a network to communicate with an external device. Examples of the network in the present embodiment include the Internet, a local area network (LAN), s public telephone network, and a short-range wireless network. The communication section 46 is a communication device and may be a network interface controller, for example.

Preferably, the substrate processing system 10 further includes a sensor 50. Typically, a plurality of sensors 50 detect the states of respective elements of the substrate processing system 10. For example, at least some of the sensors 50 detect the states of respective parts of the substrate processing apparatus 100.

The storage 24 stores as time-series data TD results output from the sensors 50 and a control parameter in the control program therein. Typically, the time-series data are stored separately for each substrate W.

The sensors 50 detect physical quantities of respective objects used by the substrate processing apparatus 100 during a period from a processing start to a processing end for the substrate W each time processing is performed on one substrate W, and output detection signals indicating the physical quantities to the controller 22. Each time the processing is performed on one substrate W, the controller 22 causes the storage 24 to store, for the substrate W, in association with time the physical quantities indicated by detection signals output from the sensors 50 during the period from the processing start to the processing end as time-series data TD.

The controller 22 acquires the time-series data TD from the sensors 50 and causes the storage 24 to store the time-series data TD. In this case, the controller 22 causes the storage 24 to store the time-series data TD in association with lot identification information, substrate identification information, processing sequence information, and lot interval information. The lot identification information is information for lot identification (e.g., a lot number). The lot indicates a processing unit of substrates W. One lot is constituted by a predetermined number of substrates W. The substrate identification information is information for identifying a substrate W. The processing sequence information is information indicating a sequence of processing on the predetermined number of substrates W constituting one lot. The lot interval information is information indicating a time interval from a processing end of a lot to a processing start of the next lot.

Figure 5A:
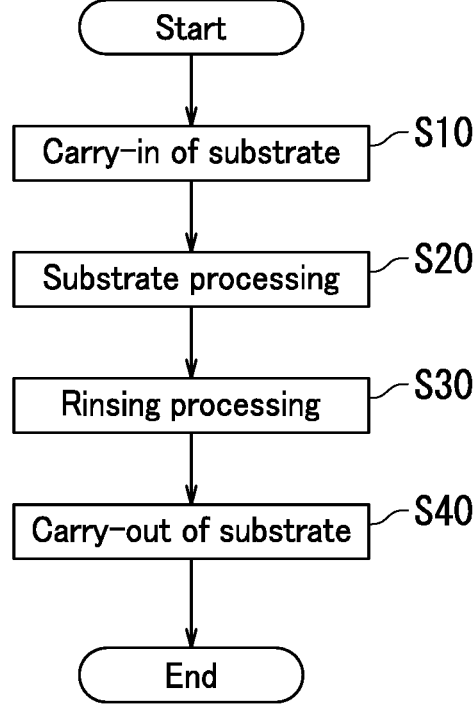
FIGS. 5A and 5B is a flowchart depicting a substrate processing method of the embodiment.
Figure 5B:
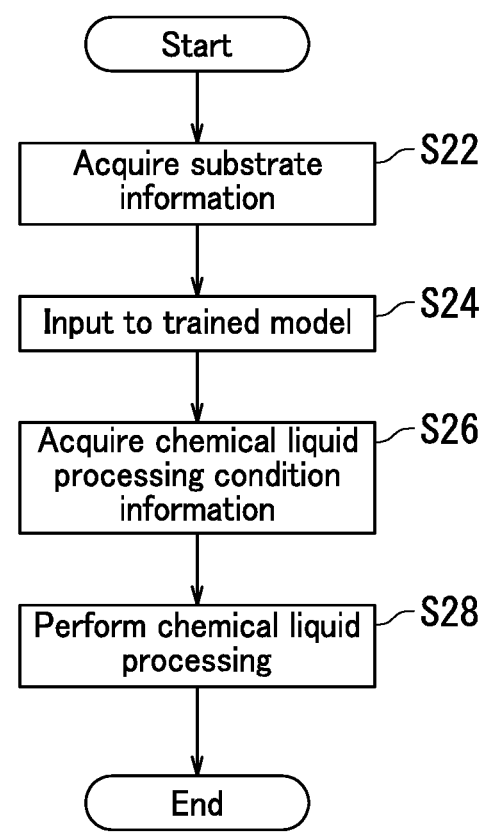

Next, a substrate processing method implemented by the substrate processing apparatus 100 of the present embodiment will be described with reference to FIGS. 1 to 5B. FIG. 5A is a flowchart depicting the substrate processing method implemented by the substrate processing apparatus 100 of the present embodiment, and FIG. 5B is a flowchart depicting the chemical liquid processing in the substrate processing method of the present embodiment.

As depicted in FIG. 5A, a processing target substrate Wp is carried into the substrate processing apparatus 100 in Step S10. The carried processing target substrate Wp is fitted on the substrate holding section 120. Typically, the processing target substrate Wp is carried into the substrate processing apparatus 100 by the center robot CR.

In Step S20, the processing target substrate Wp is processed with the chemical liquid. The chemical liquid supply section 130 supplies the chemical liquid to the processing target substrate Wp. The chemical liquid is discharged from the nozzle 132 of the chemical liquid supply section 130 toward the upper surface Wa of the processing target substrate Wp. The chemical liquid covers the upper surface Wa of the processing target substrate Wp. Through the above, the processing target substrate Wp is processed with the chemical liquid. Note that the substrate W is rotated by the substrate holding section 120 during the processing with the chemical liquid on the processing target substrate Wp. Rotation of the processing target substrate Wp may be continued directly before carry-out of the processing target substrate Wp.

In step S30, the processing target substrate Wp is rinsed with the rinse liquid. The rinse liquid supply section 140 supplies the rinse liquid to the processing target substrate Wp. The rinse liquid is discharged from the nozzle 142 of the rinse liquid supply section 140 toward the upper surface Wa of the processing target substrate Wp. The rinse liquid covers the supper surface Wa of the processing target substrate Wp. Through the above, the processing target substrate Wp is processed with the rinse liquid.

In Step S40, the processing target substrate Wp is separated from the substrate holding section 120 and carried out. Typically, the processing target substrate Wp is carried out of the substrate processing apparatus 100 by the center robot CR. The processing target substrate Wp is processed with the chemical liquid in the manner described above.

In the substrate processing apparatus 100 of the present embodiment, the processing target substrate Wp is processed with the chemical liquid as depicted in FIG. 5B.

In Step S22, the substrate information of the processing target substrate Wp is acquired. The substrate information acquiring section 22a acquires the substrate information of the processing target substrate Wp. The substrate information includes the hardened layer thickness information or the ion implantation condition information of the processing target substrate Wp.

For example, the controller 22 acquires the hardened layer thickness information or the ion implantation condition information of the processing target substrate Wp from the storage 24. Note that the thickness of the hardened layer in the processing target substrate Wp may be measured in the substrate processing system 10 or the substrate processing apparatus 100. Alternatively, the thickness of the hardened layer in the processing target substrate Wp may be measured outside the substrate processing system 10 and the substrate processing apparatus 100.

Alternatively, the ion implantation on the processing target substrate Wp may be performed in the substrate processing system 10 or the substrate processing apparatus 100. Alternatively, the ion implantation on the processing target substrate Wp may be performed outside the substrate processing system 10 and the substrate processing apparatus 100. Note that that the controller 22 may acquire substrate information other than the hardened layer thickness information and the ion implantation condition information.

In Step S24, the substrate information of the processing target substrate Wp is input to a trained model LM. Although described later in detail, the trained model LM is built based on training data containing substrate information of a training target substrate WL, chemical liquid processing condition information indicating a processing condition of the chemical liquid processing performed on the training target substrate WL, and processing result information indicating a result of the chemical liquid processing performed on the training target substrate WL. The trained model LM outputs chemical liquid processing condition information Rp corresponding to the substrate information of the processing target substrate Wp.

In Step S26, chemical liquid processing condition information is acquired from the trained model LM. The chemical liquid processing condition information acquiring section 22b acquires the chemical liquid processing condition information corresponding to the substrate information from the trained model LM.

In Step S28, the substrate holding section 120 and the chemical liquid supply section 130 perform the chemical liquid processing on the processing target substrate Wp according to the chemical liquid processing condition information. In the substrate processing apparatus 100 illustrated in FIG. 3, the chemical liquid supply section 130 supplies the chemical liquid to the processing target substrate Wp according to the chemical liquid processing condition information. The processing target substrate Wp is processed with the chemical liquid in the manner described above.

In the present embodiment, the chemical liquid processing condition information corresponding to the substrate information including the hardened layer thickness information or the ion implantation condition information of the processing target substrate Wp is acquired from the trained model LM built through machine training, and the chemical liquid processing is performed according to the chemical liquid processing condition indicated in the chemical liquid processing condition information. According to the present embodiment, the chemical liquid processing can be appropriately performed according to the thickness of the hardened layer in the processing target substrate Wp.

Figure 6A:
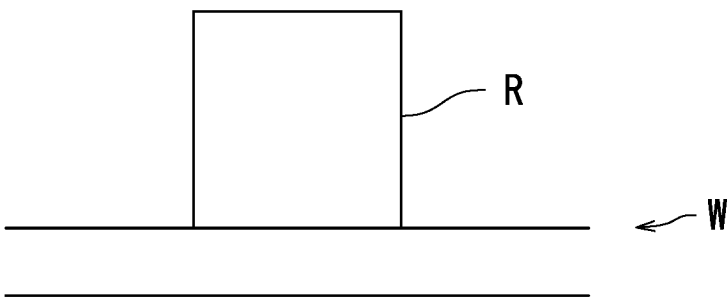
FIGS. 6A to 6C each are a schematic diagram illustrating a formation process of a hardened layer formed in a substrate to be processed in the substrate processing apparatus of the embodiment.
Figure 6B:
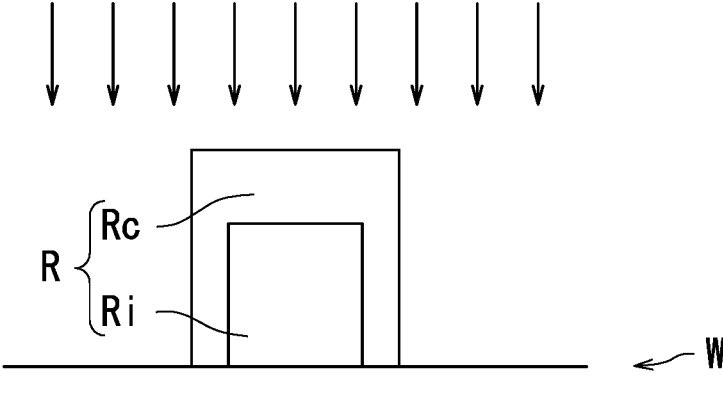
Figure 6C:
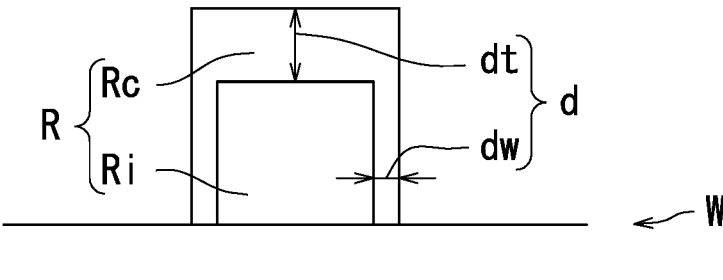

The hardened layer formed in a substrate W, which is the target for the substrate processing method of the present embodiment, will be described next with reference to FIGS. 6A to 6C. FIGS. 6A to 6C each are a schematic diagram explaining formation of a hardened layer in a resist layer R of the substrate W.

As illustrated in FIG. 6A, the resist layer R is formed on the upper surface of the substrate W. The resist layer R extends in a direction perpendicular to the main surface of the substrate W. The resist layer R is patterned into a specific shape.

As illustrated in FIG. 6B, ions are implanted into the substrate W. Here, the ions are implanted in a direction parallel to the normal direction of the main surface of the substrate W. Ion implantation changes a characteristic of the surface of the substrate W. At this time, the characteristic of the surface of the resist layer R is also changed to form a hardened layer Rc. Note that the characteristic in the interior of the resist layer R remains unchanged and remains as an inner layer Ri. The hardened layer Rc is harder than the inner layer Ri.

As illustrated in FIG. 6C, the hardened layer Rc has a specific thickness d. In detail, the thickness d of the hardened layer Rc includes a height dt of the hardened layer Rc and a width of dw of the hardened layer Rc. In a case in which the ions are isotropiccally implanted into the resist layer R, the height dt is approximately equal to the width dw.

By contrast, when the ions are implanted anisotropically into the resist layer R, the height dt differs from the width dw. For example, as illustrated in FIG. 6B, when the ions are implanted in a direction parallel to the normal direction of the main surface of the substrate W, the height dt is greater than the width dw.

The hardened layer formed in a substrate W, which is a target for the substrate processing method of the present embodiment, will be described next with reference to FIGS. 7A to 7D. FIGS. 7A to 7D each are a schematic diagram explaining formation of a hardened layer in the resist layer R of the substrate W.

Figures 7A, 7B, 7C, 7D:
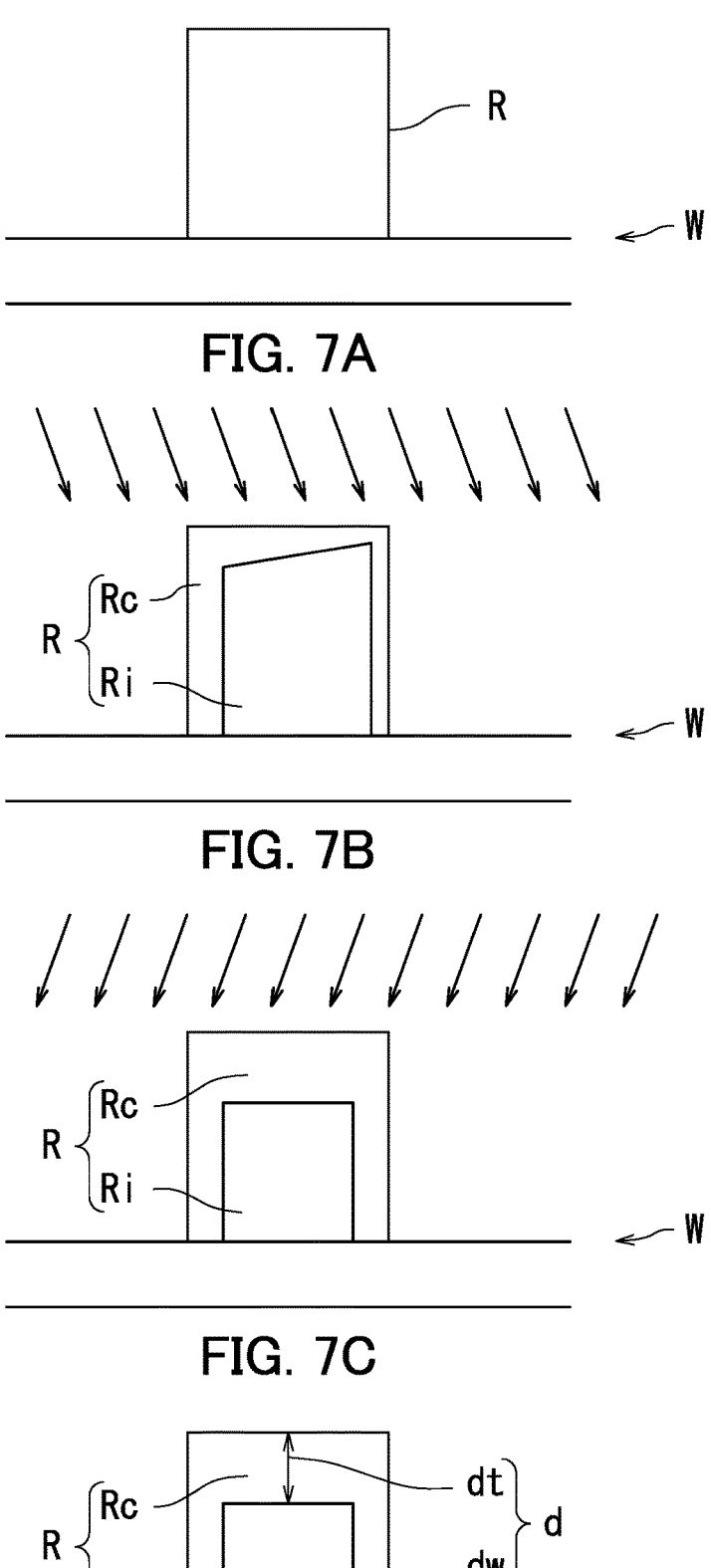
FIGS. 7A to 7D each are a schematic diagram illustrating a formation process of a hardened layer formed in a substrate to be processed in the substrate processing apparatus of the embodiment.

As illustrated in FIG. 7A, the resist layer R is formed on the upper surface of the substrate W. The resist layer R extends in a direction perpendicular to the main surface of the substrate W.

As illustrated in FIG. 7B, ions are implanted into the substrate W. Here, the ions are implanted in a direction inclined in a specific direction (leftward with respect to the paper surface) with respect to the normal direction of the main surface of the substrate W. Ion implantation changes the characteristic of the surface of the substrate W. At this time, the characteristic of the surface of the resist layer R is changed to form the hardened layer Rc. In this case, the left part of the hardened layer Rc is relatively thick while the right part of the hardened layer Rc is relatively thin relative to the resist layer R.

As illustrated in FIG. 7C, the ions are implanted into the substrate W. Here, the ions are implanted in a direction inclined in another direction (rightward with respect to the paper surface) with respect to the normal direction of the main surface of the substrate W. Ion implantation thickens the hardened layer Rc being a surface portion of the resist layer R of which characteristic has been changed.

As illustrated in FIG. 7D, the hardened layer Rc has a specific thickness d. In detail, the thickness d of the hardened layer Rc includes a height dt of the hardened layer Rc and a width of dw of the hardened layer Rc. The hardened layer Rc is formed in the manner described above.

Note that ion implantation is performed in the left and right oblique directions of the resist layer R, with a result that the widths of the left part and the right part of the hardened layer Rc can be approximately equalized. Furthermore, ion implantation in the oblique directions on the resist layer R can increase not only the height dt of the hardened layer Rc but also the width dw of the hardened layer Rc.

As described above, any of the thickness d, the height dt, and the width dw of the hardened layer Rc may be measured using a measurement instrument. Alternatively, any of the thickness d, the height dt, and the width dw of the hardened layer Rc are defined according to either or both a characteristic (e.g., composition, thickness, or width) of the resist layer R and a condition (e.g., ion species, acceleration energy, implantation amount, or direction of implantation) for the ion implantation. Therefore, any of the thickness d, the height dt, and the width dw of the hardened layer Rc can be determined according to a condition for ion implantation.

As has been described with reference to FIG. 1, the trained model LM is created from the training data LD and the training data LD is generated from the time-series data TDL of the substrate processing apparatus 100L.

Figure 8:
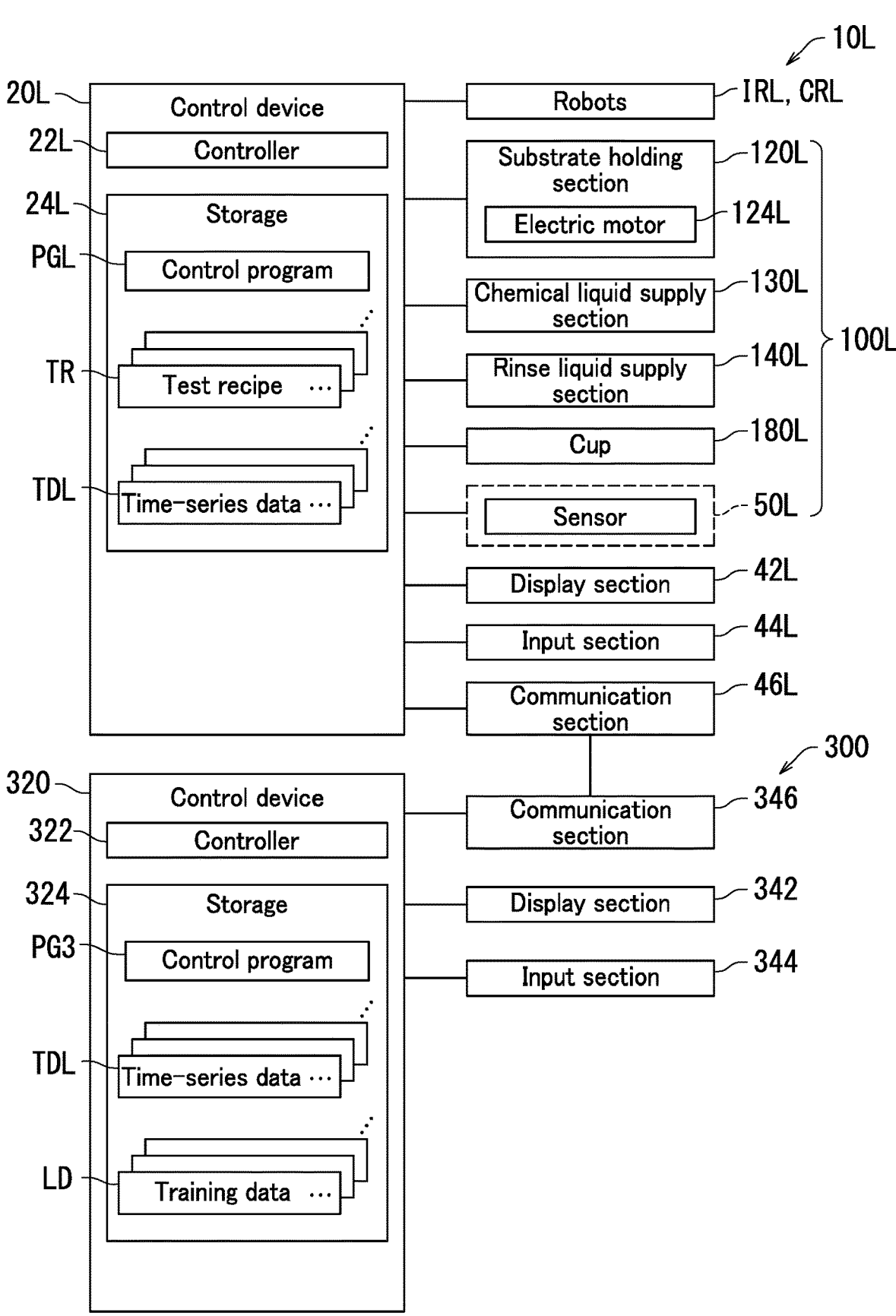
FIG. 8 is a block diagram of a training data generating device and a substrate processing system including a substrate processing apparatus of the embodiment.

Generation of the training data LD will be described next with reference to FIG. 8. FIG. 8 is a block diagram of the training data generating device 300 and a substrate processing system 10L including a substrate processing apparatus 100L. Here, the training data generating device 300 is connected to the substrate processing apparatus 100L in a communicable manner. The substrate processing system 10L including the substrate processing apparatus 100L illustrated in FIG. 8 is the same as the substrate processing system 10 illustrated in the block diagram of FIG. 4 in all aspects other than that a controller 22L includes neither the substrate information acquiring section 22a nor the chemical liquid processing condition information acquiring section 22b and that storage 24L does not store the trained model LM and stores a test recipe TR therein. Therefore, duplicate description is omitted for avoiding redundancy.

The substrate processing system 10L includes a plurality of substrate processing apparatuses 100L, an indexer robot IRL, a center robot CRL, a control device 20L, a display section 42L, an input section 44L, a communication section 46L, and a sensor 50L. The substrate processing apparatuses 100L, the indexer robot IRL, the center robot CRL, the control device 20L, the display section 42L, the input section 44L, and the communication section 46L respectively have the same configurations as those of the substrate processing apparatuses 100, the indexer robot IR, the center robot CR, the control device 20, the display section 42, the input section 44, and the communication section 46 of the substrate processing system 10 illustrated in FIG. 4.

Also, the substrate processing apparatuses 100L each include a substrate holding section 120L, a chemical liquid supply section 130L, a rinse liquid supply section 140L, and a cap 180L. Preferably, the chamber 110L, the substrate holding section 120L, the chemical liquid supply section 130L, the rinse liquid supply section 140L, and the cap 180L respectively have the same configurations as those of the substrate holding section 120, the chemical liquid supply section 130, the rinse liquid supply section 140, and the cap 180 illustrated in FIGS. 3 and 4.

The control device 20L includes a controller 22L and storage 24L. The storage 24L stores a control program PGL therein. The substrate processing apparatuses 100L each operate according to procedures defined in the control program PGL.

The storage 24L further stores a plurality of test recipes TR therein. The test recipes TR include recipes different in chemical liquid processing condition. Therefore, when the controller 22L controls processing on training target substrates WL according to the test recipes TR, the different training target substrates WL undergo processing with different chemical liquids.

The storage 24L stores time-series data TDL of the training target substrates WL therein. The time-series data TDL is data indicating change in physical quantity in the substrate processing apparatuses 100L over time. The time-series data TDL indicates a plurality of physical quantities detected by the sensor 50L. The time-series data TDL may contain data indicating a production process before the training target substrates WL are processed by the substrate processing apparatuses 100L. Note that the time-series data TDL contains substrate information including hardened layer thickness information or ion implantation condition information, chemical liquid processing condition information indicating conditions for chemical liquid processing having been performed on the training target substrates WL, and processing result information indicating results of the chemical liquid processing having been performed on the training target substrates WL.

The training data generating device 300 is connected to the substrate processing apparatuses 100L in a communicable manner. The training data generating device 300 receives at least a portion of the time-series data TDL of each substrate processing apparatus 100L.

The training data generating device 300 includes a control device 320, a display section 342, an input section 344, and a communication section 346. The training data generating device 300 communicates with the control device 20L of each of the substrate processing apparatuses 100L via the communication section 346. The display section 342, the input section 344, and the communication section 346 respectively have the same configurations as those of the display section 42, the input section 44, and the communication section 46.

The control device 320 includes a controller 322 and storage 324. The storage 324 stores a control program PG3 therein. The training data generating device 300 operates in accordance with the procedures defined in the computer program PG3.

The controller 322 receives at least a portion of the time-series data TDL from each substrate processing apparatus 100L, and causes the storage 324 to store the received time-series data TDL. The storage 324 stores at least a portion of the time-series data TDL of the training target substrates WL therein. The time-series data TDL is transmitted from each substrate processing apparatus 100L to the training data generating device 300 via the communication section 46L and the communication section 346. The controller 322 causes the storage 324 to store at least a portion of the transmitted time-series data TDL. The time-series data TDL stored in the storage 324 contains the substrate information of the time-series data TDL, the chemical liquid processing condition information, and the processing result information.

The controller 322 acquires the substrate information, the chemical liquid processing condition information, and the processing result information of the training target substrates WL from the time-series data TDL stored in the storage 324. Furthermore, the controller 322 groups the substrate information, the chemical liquid processing condition information, and the processing result information of the training target substrates WL to generate training data LD and the storage 324 stores the training data LD.

Figure 9:
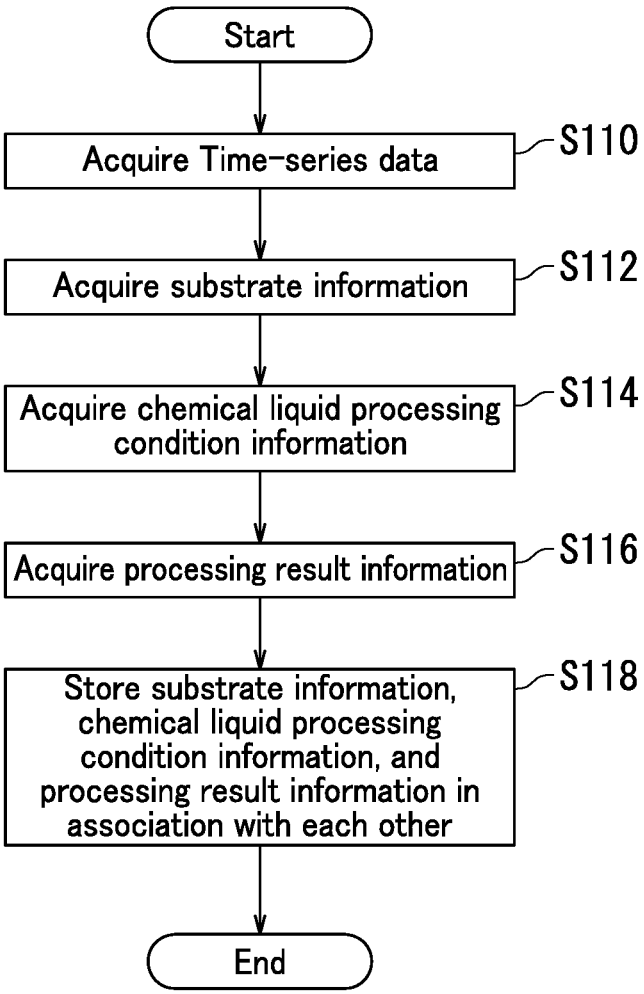
FIG. 9 is a flowchart depicting a training data generation method of the embodiment.

With reference to FIGS. 8 and 9, a training data generation method of the present embodiment will be described next. FIG. 9 is a flowchart depicting the training data generation method of the present embodiment. Training data generation is performed in the training data generating device 300.

As illustrated in FIG. 9, the time-series data TDL of the training target substrates WL are acquired in Step S110. Typically, the training data generating device 300 receives at least a portion of time-series data TDL of each training target substrate WL from the substrate processing apparatus 100L. The storage 324 stores the received time-series data TDL.

In Step S112, substrate information is extracted from the time-series data TDL of the training target substrates WL stored in the storage 324. The substrate information includes hardened layer thickness information or ion implantation condition information. The controller 322 acquires the substrate information of the training target substrates WL from the time-series data TDL stored in the storage 324.

In Step S114, chemical liquid processing condition information of the training target substrates WL is extracted from the time-series data TDL of the training target substrates WL stored in the storage 324. The controller 322 acquires the chemical liquid processing condition information of the training target substrates WL from the time-series data TDL stored in the storage 324.

In Step S116, processing result information of the training target substrates WL is extracted from the time-series data TDL of the training target substrates WL stored in the storage 324. The controller 322 acquires the processing result information of the training target substrates WL from the time-series data TDL stored in the storage 324.

In step S118, the substrate information, the chemical liquid processing condition information, and the processing result information of the training target substrates WL are associated with one another to generate training data LD and the storage 324 stores the training data LD for each of the training target substrates WL.

The generated training data contains the substrate information, the chemical liquid processing condition information, and the processing result information of each of the training target substrates WL associated with each other in the present embodiment. Training data such as above is favorably used for training processing.

Note that the training data generating device 300 in FIG. 8 is connected to one substrate processing apparatus 100L in a communicable manner in the present embodiment, which should not be taken to limit the present embodiment. The training data generating device 300 may be connected to the substrate processing apparatuses 100L in a communicable manner.

Furthermore, although the time-series data TDL generated in the substrate processing apparatus 100L is transmitted to the training data generating device 300 via the communication section 46L and the communication section 346 in the description made with reference to FIGS. 8 and 9, which should not be taken to limit the present embodiment. It is possible that the control device 320 of the training data generating device 300 is incorporated in the control device 20 of the substrate processing system 10 that includes the substrate processing apparatuses 100L and the training data LD is generated from the time-series data TDL in the substrate processing system 10 without transmission of the time-series data TDL to the network.

Figure 10:
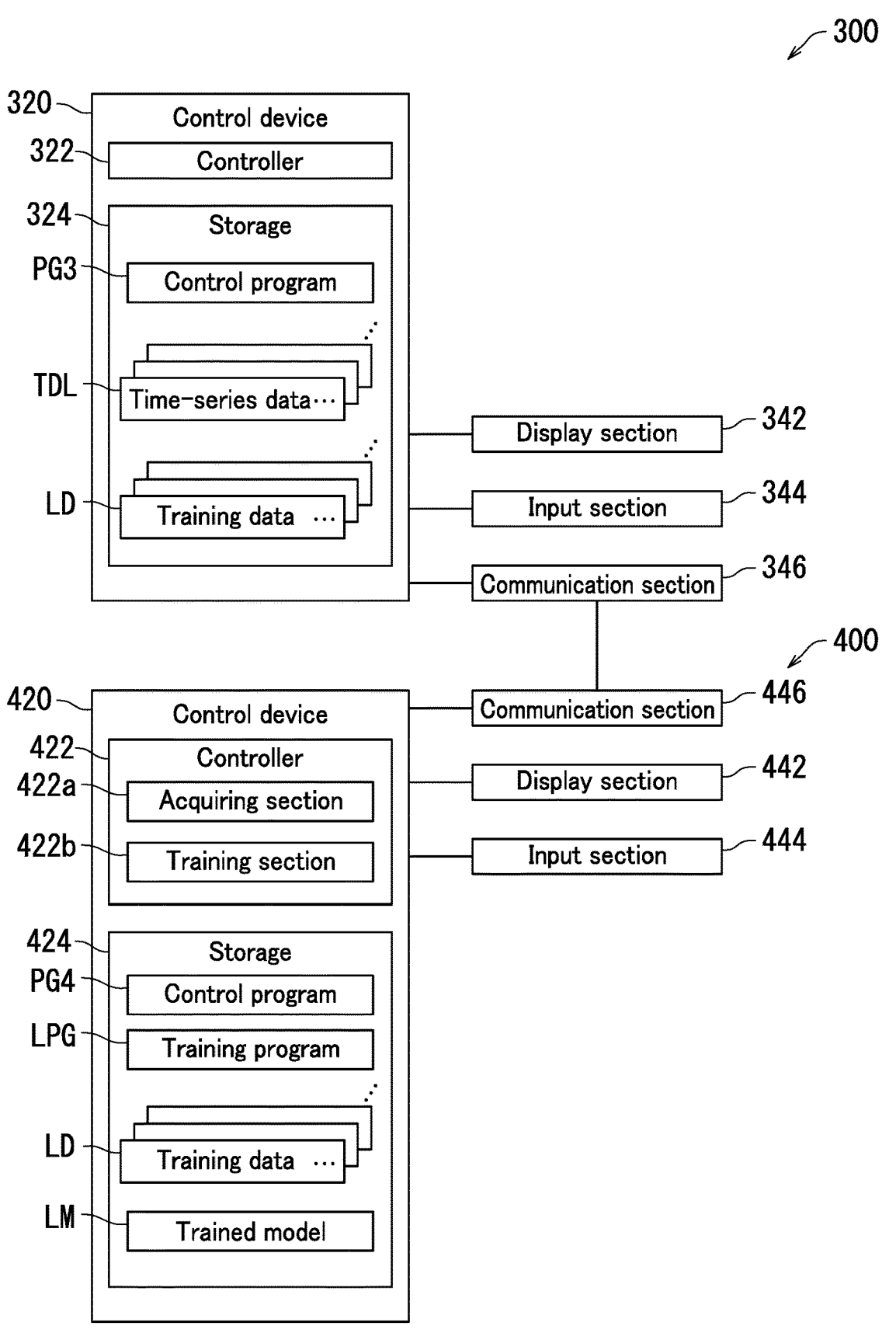
FIG. 10 is a block diagram of the training data generating device and a training device of the embodiment.

Creation of the trained model LM in the present embodiment will be described next with reference to FIG. 10. FIG. 10 is a schematic diagram of the training data generating device 300 and the training device 400 of the present embodiment. The training data generating device 300 and the training device 400 communicate with each other.

The training device 400 is connected to the training data generating device 300 in a communicable manner. The training device 400 receives training data LD from the training data generating device 300. The training device 400 creates a trained model LM through machine training based on the training data LD.

The training device 400 includes a control device 420, a display section 442, an input section 444, and a communication section 446. The display section 442, the input section 444, and the communication section 446 respectively have the same configurations as those of the display section 42, the input section 44, and the communication section 46 of the substrate processing system 10 illustrated in FIG. 4.

The control device 420 includes a controller 422 and storage 424. The storage 424 stores a control program PG4 therein. The training device 400 operates in accordance with the procedures defined in the computer program PG4.

The storage 424 stores the training data LD therein. The training data LD is transmitted from the training data generating device 300 to the training device 400 via the communication section 346 and the communication section 446. The controller 422 causes the storage 424 to store the transmitted training data LD. In the training data LD stored in the storage 424, the substrate information, the chemical liquid processing condition information, and the processing result information of the time-series data TDL are associated with one another.

The storage 424 stores a training program LPG therein. The training program LPG is a program used for finding out a certain rule in plural pieces of training data LD and executing a machine training algorithm for creating a trained model LM expressing the found rule. The controller 422 creates trained model LM in a manner to perform machine training of the training data LD through execution of the training program LPG stored in the storage 424 to adjust a parameter of an inference program.

The machine training algorithm is not limited specifically as long as it is supervised training algorithm, and may be a decision tree, a nearest neighbor method, a simple Bayesian classifier, a support vector machine, or a neural network, for example. Therefore, the trained model LM is created using the decision tree, the nearest neighbor method, the simple Bayesian classifier, the support vector machine, or the neural network. Machine training for creating the trained model LM may use an error back propagation method.

For example, the neural network includes an input layer, a single or plurality of intermediate layers, and an output layer. Specifically, the neural network is a deep neural network (DNN), a recurrent neural network (RNN), or a convolutional neural network (CNN), for example, and performs deep learning. For example, the deep neural network includes an input layer, a plurality of intermediate layers, and an output layer.

The controller 422 includes an acquiring section 422a and a training section 422b. The acquiring section 422a acquires the training data LD from the storage 424. The training section 422b performs machine training of the training data LD through execution of the training program LPG stored in the storage 424 to create a trained model LM from the training data LD.

The training section 422b performs machine training of plural pieces of training data LD based on the training program LPG. As a result, a certain rule is found out among the plural pieces of training data LD to create a trained model LM. That is, the trained model LM is built through machine training of the training data LD. The storage 424 stores the trained model LM.

Thereafter, the trained model LM is typically transmitted to the substrate processing system 10 and the storage 24 stores the trained model LM. In this case, as described above with reference to FIG. 4, the storage 24 of the control device 20 in the substrate processing system 10 stores the trained model LM therein and the chemical liquid processing condition information acquiring section 22b acquires the chemical liquid processing condition information from the trained model LM stored in the storage 24.

However, the present disclosure is not limited to the above. It is possible that the storage 24 does not store the trained model LM therein and the chemical liquid processing condition information acquiring section 22b acquires the chemical liquid processing condition information from the outside of the substrate processing system 10. For example, it is possible that the chemical liquid processing condition information acquiring section 22b transmits the substrate information of a processing target substrate Wp to the trained model LM of the training device 400 via the communication section 46 and the communication section 446 and receives the chemical liquid processing condition information output from the trained model LM of the training device 400 via the communication section 446 and the communication section 46.

Figure 11:
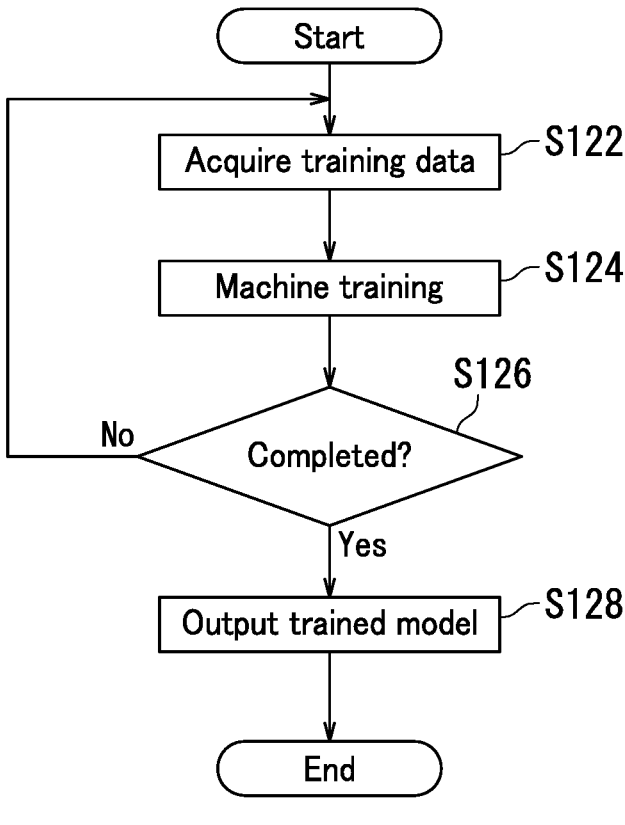
FIG. 11 is a flowchart depicting a training method and a trained model creation method of the embodiment.

A training method implemented by the training device 400 of the present embodiment will be described next with reference to FIGS. 1 to 11. FIG. 11 is a flowchart depicting the training method of the present embodiment. Training of the training data LD and creation of the trained model LM are performed in the training device 400.

As depicted in FIG. 11, the acquiring section 422a of the training device 400 acquires plural pieces of training data LD from the storage 424 in Step S122. In the training data LD, the substrate information, the chemical liquid processing condition information, and the processing result information of the training target substrates WL are associated with one another.

Next, in Step S124, the training section 422b performs machine training of the plural pieces of training data LD based on the training program LPG.

Next, in Step S126, the training section 422b determines whether or not machine training of the training data LD has been completed. Whether or not the machine training has been completed is determined according to a prescribed condition. For example, machine training will be completed when machine training is performed on a predetermined number or more of pieces of training data LD.

If machine training has not been completed (No in Step S126), the routine returns to Step S122. If so, machine training is repeated. If machine training has been completed (Yes in Step S126) by contrast, the routine proceeds to Step S128.

In Step S128, the training section 422b outputs as a trained model LM a model (at least one function) to which the latest parameters (coefficients), that is, a plurality of trained parameters (coefficients) are applied. The storage 424 stores the trained model LM.

The training method ends and the trained model LM is created in the manner described above. According to the present embodiment, machine training of the training data LD can create the trained model LM.

Note that although the training device 400 in FIG. 10 is connected to a single training data generating device 300 in a communicable manner, which should not be taken to limit the present embodiment. The training device 400 may be connected to a plurality of training data generating devices 300 in a communicable manner.

Furthermore, the training data LD generated in the training data generating device 300 is transmitted to the training device 400 via the communication section 346 and the communication section 446 in the description made with reference to FIGS. 10 and 11, which should not be taken to limit the present embodiment. It is possible that the control device 420 of the training device 400 is incorporated in the control device 320 of the training data generating device 300 and the trained model LM is created from the training data LD in the training data generating device 300 without transmission of the training data LD to the network.

Furthermore, the time-series data TDL generated in the substrate processing apparatus 100L is transmitted to the training data generating device 300 via the communication section 46L and the communication section 346 and the training data LD generated in the training data generating device 300 is transmitted to the training device 400 via the communication section 346 and the communication section 446 in the description made with reference to FIGS. 8 to 11, which should not be taken to limit the present embodiment. It is possible that the control device 320 of the training data generating device 300 and the control device 420 of the training device 400 are incorporated in the control device 20 of the substrate processing system 10L and the trained model LM is created from the time-series data TDL through the training data LD in the substrate processing system 10L without transmission of the time-series data TDL and the training data LD to the network.

Figure 12:
FIG. 12 is a diagram of training data input to the training device of the embodiment.

One example of the training data LD will be described next with reference to FIG. 12. FIG. 12 is a diagram indicating an example of the training data LD.

FIG. 12 indicates the substrate information of each of training target substrates WL, the chemical liquid processing conditions of the training target substrate WL, and the processing results of the training target substrate WL. Here, the substrate information is information about a hardened layer thickness of the training target substrate WL. The thickness of a hardened layer in the resist layer of the training target substrate WL can be acquired by measuring the hardened layer. The chemical liquid processing condition indicates a condition for chemical liquid processing performed on the training target substrate WL. The chemical liquid processing condition includes a concentration of the chemical liquid, a temperature of the chemical liquid, a supply amount of the chemical liquid, and a rotational speed of the training target substrate WL when the chemical liquid is supplied, for example. The processing result indicates a result after the chemical liquid processing on the training target substrate WL. The training data LD in FIG. 12 includes training data LD1 to training data LD1000.

The training data LD1 indicates substrate information, a chemical liquid processing condition, and a processing result of a training target substrate WL1. Here, Ld1 of the training data LD1 indicates the thickness of the hardened layer in the training target substrate WL1. Also, Lp1 indicates a condition for the chemical liquid processing having been performed on the training target substrate WL1.

The processing result information indicates a processing result of the chemical liquid processing on the training target substrate WL1. The processing result may be determined according to whether or not any anomalies of the characteristic have been found in the training target substrate WL1. Since the result of chemical liquid processing performed on the training target substrate was good, GOOD is indicated in the training data LD1. If the result of chemical liquid processing performed on a training target substrate is not good by contrast, POOR is indicated in a training data.

The training data LD2 to LD1000 are generated in correspondence with the respective training target substrates WL2 to WL1000. Chemical liquid processing conditions for the training target substrates WL may be the same as or different from each other. Processing results significantly vary depending on the thicknesses of the hardened layers in the training target substrates WL.

The number of pieces of the training data LD indicated in FIG. 12 is 1000, which should not be taken to limit the present embodiment. The number of pieces of the data may be smaller than 1000 or greater than 1000. However, the number of pieces of the data should be as large as possible.

Note that the substrate information in the training data LD preferably contains a plurality of items. For example, the hardened layer thickness information may contain hardened layer height information indicating the height of the hardened layer and hardened layer width information indicating the width of the hardened layer.

Figure 13:
FIG. 13 is a diagram of training data input to the training device of the embodiment.

FIG. 13 is a diagram indicating an example of the training data LD. As indicated in FIG. 13, the training data LD contains substrate information of each training target substrate WL, chemical liquid processing condition information of the training target substrate WL, and processing result information of the training target substrate WL. The training data LD in FIG. 13 is the same as the training data LD described with reference to FIG. 12 in all aspects other than that the substrate information of the training target substrates WL contains hardened layer height information and hardened layer width information. Therefore, duplicate description is omitted for avoiding redundancy.

Here, the substrate information contains the hardened layer thickness information and the hardened layer width information of each training target substrate WL. The thickness and the width of a hardened layer in the resist layer of the training target substrate WL can be acquired by measuring the hardened layer. The training data LD in FIG. 13 includes training data LD1 to LD1000.

The training data LD1 indicates substrate information, a chemical liquid processing condition, and a processing result of a training target substrate WL1. Here, Ldt1 in the training data LD1 indicates the height of the hardened layer in the training target substrate WL1. Ldw1 indicates the width of the hardened layer in the training target substrate WL1.

The training data LD2 to LD1000 are generated in correspondence with the respective training target substrate WL2 to WL1000. The processing results significantly vary depending on the heights and the widths in the hardened layers of the training target substrates WL. The training data LD preferably contains an item that greatly contributes to variation in results of the chemical liquid processing on the training target substrates WL.

Note that in the description made with reference to FIGS. 12 and 13, GOOD is indicated if the processing result is good while POOR is indicated if the processing result is not good and the processing results in the training data LD1 to LD1000 are binarized, which should not be taken to limit the present embodiment. The processing results may be classified into three or more values. Alternatively, the processing results may be classified into any value between the minimum value and the maximum value. For example, the processing results may be converted into numerals in consideration of the use amount (supply amount) of the chemical liquid or time require for the chemical liquid processing, in addition to the characteristic of the training target substrates WL.

Note that the chemical liquid processing condition preferably includes a plurality of items in the training data LD. For example, the chemical liquid processing condition may include a concentration, a temperature, and a supply amount of the chemical liquid, a discharge pattern of the chemical liquid for a training target substrate, and the rotational speed of the substrate holding section 120 in the chemical liquid processing.

Figure 14:
FIG. 14 is a diagram of training data input to the training device of the embodiment.

The training data LD used in the training method of the present disclosure will be described next with reference to FIG. 14. FIG. 14 is a diagram indicating an example of the training data LD.

As illustrated in FIG. 14, the training data LD includes training data LD1 to LD1000. The training data LD indicates substrate information of each training target substrate WL, a chemical liquid processing condition of the training target substrate WL, and processing result information of the training target substrate WL. Here, the chemical liquid processing condition includes the concentration of the chemical liquid, the temperature of the chemical liquid, the supply amount of the chemical liquid, the discharge pattern of the chemical liquid for a training target substrate, and the rotational speed of the training target substrate when the chemical liquid is supplied.

The concentration of the chemical liquid indicates a concentration of the chemical liquid having been used for the training target substrate WL. The temperature of the chemical liquid indicates a temperature of the chemical liquid having been used for the training target substrate WL. The supply amount of the chemical liquid indicates a supply amount of the chemical liquid having been used for the training target substrate WL. The discharge pattern of the chemical liquid for the training target substrate indicates a path (travel path of the nozzle 132) where the chemical liquid has been discharged toward the training target substrate WL. The rotational speed of the training target substrate indicates a rotational speed of the training target substrate WL when the chemical liquid has been supplied. Furthermore, in the training data LD, "GOOD" is indicated if the result of the chemical liquid processing on a training target substrate is good while "POOR" is indicated if the result of the chemical liquid processing on the training target substrate is not good.

In the training data LD1, Lc1 indicates a concentration of the chemical liquid having been used for the training target substrate WL1 and Lt1 indicates a temperature of the chemical liquid having been used for the training target substrate WL1. Also, Ls1 indicates a supply amount of the chemical liquid having been used for the training target substrate WL1, Le1 indicates a discharge pattern of the chemical liquid for the training target substrate WL1, and Lv1 indicates a rotational speed of the training target substrate WL1 when the chemical liquid has been supplied to the training target substrate WL1. In the training data LD1, "GOOD" is indicated as the processing result since the processing result of the chemical liquid processing on the training target substrate WL1 was good.

The same applies to the training data LD2 to LD1000. Note that chemical liquid processing conditions for the respective training target substrates WL may be the same as or different from each other. For example, at least some of the items of the chemical liquid processing conditions may be the same as or different from each other. Alternatively, all the items of the chemical liquid processing conditions may be the same as or different from each another. The processing results vary depending on the substrate states and the chemical liquid processing conditions of the training target substrates WL.

Figure 15A:
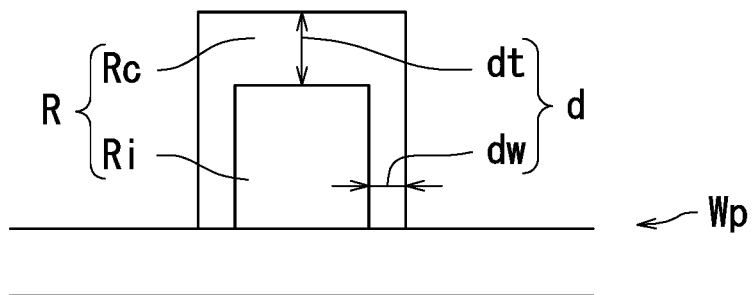
FIGS. 15A and 15B is a schematic diagram illustrating a processing target substrate including a resist layer, which is a processing target of the substrate processing apparatus of the embodiment, with a hardened layer formed therein.

The chemical liquid processing performed in a substrate processing apparatus 100 of the present embodiment will be described next with reference to FIGS. 1 to 15B. FIG. 15A is a schematic diagram of a processing target substrate Wp, and FIG. 15B indicates chemical liquid processing condition information Rp generated in the trained model LM.

As illustrated in FIG. 15A, the processing target substrate Wp includes a resist layer R with a hardened layer Rc formed therein. Here, the hardened layer Rc has a height of dt and a width of dw.

Figure 15B:

FIG. 15B is a diagram indicating the chemical liquid processing condition information Rp. The chemical liquid processing condition information Rp contains the concentration of the chemical liquid, the temperature of the chemical liquid, the supply amount of the chemical liquid, the discharge pattern of the chemical liquid for a training target substrate, and the rotational speed of the training target substrate in supply of the chemical liquid.

In the chemical liquid processing condition information Rp, Rc indicates a concentration of the chemical liquid to be used for the processing target substrate Wp and Rt indicates a temperature of the chemical liquid to be used for the processing target substrate Wp. Also, Rs indicates a supply amount of the chemical liquid to be used for the processing target substrate Wp, Pe indicates a discharge pattern of the chemical liquid to be used for the processing target substrate Wp, and Rv indicates a rotational speed of the processing target substrate Wp in supply of the chemical liquid to the processing target substrate Wp.

In this case, the controller 22 controls the substrate holding section 120 and the chemical liquid supply section 130 to perform the chemical liquid processing on the processing target substrate Wp according to the chemical liquid processing condition indicated in the chemical liquid processing condition information Rp.

Note that the chemical liquid processing condition includes five items of the concentration of the chemical liquid, the temperature of the chemical liquid, the supply amount of the chemical liquid, the discharge pattern of the chemical liquid, and the rotational speed of a processing target substrate in the description made with reference to FIGS. 14 to 15B, which should not be taken to limit the present embodiment. The chemical liquid processing condition may include any one or more of the five items. Alternatively, the chemical liquid processing condition may be a combination of any one or more of the five items and another item. Alternatively, the chemical liquid processing condition may include one or more items different from the five items.

Note that the substrate information of each training target substrate WL is information obtained by measuring the thickness of the hardened layer in the above description made with reference to FIGS. 12 to 15B, which should not be taken to limit the present embodiment. The substrate information of each training target substrate WL may contain information about a condition for ion implantation for hardened layer formation.

Figure 16:
FIG. 16 is a diagram of training data input to the training device of the embodiment.

The training data LD used in the training method of the present embodiment will be described next with reference to FIG. 16. FIG. 16 is a diagram indicating an example of the training data LD. Note that the training data LD in FIG. 16 is the same as the training data LD describe above with reference to FIG. 12 in all aspects other than that the substrate information indicates an ion implantation condition for hardened layer formation in training target substrates WL. Therefore, duplicate description is omitted for avoiding redundancy.

As indicated in FIG. 16, the training data LD includes training data LD1 to LD1000. The training data LD indicates the substrate information of each training target substrate WL, the chemical liquid processing condition of the training target substrate WL, and the processing result information of the training target substrate WL. Here, the substrate information of the training target substrate WL contains ion implantation condition information indicating an ion implantation condition for forming a hardened layer in the training target substrate WL.

Furthermore, the ion implantation condition information contains an ion species, an acceleration energy, an implantation amount, and an implantation direction. The ion species indicates a species of the ions having been used for ion implantation, and the acceleration energy indicates an acceleration energy of the ion species in ion implantation. Furthermore, the implantation amount indicates an amount of the implanted ion species, and the implantation direction indicates a direction in which the ions have been implanted to the training target substrate WL.

In the training data LD1, Lk1 indicates an ion species having been used for ion implantation in formation of a hardened layer in a training target substrate WL1 and Lal indicates an acceleration energy in ion implantation for forming the hardened layer in the training target substrate WL1. Also, Lul indicates an ion implantation amount in formation of the hardened layer in the training target substrate WL1 and Ld1 indicates a direction in which the ions have been implanted to the training target substrate WL for forming the hardened layer in the training target substrate WL1.

The same applies to the training data LD2 to LD1000. As described above, the substrate information may indicate a condition for ion implantation for hardened layer formation rather than the thickness of the hardened layer itself. Note that the ion implantation condition information may include any items of the ion species, the acceleration energy, the implantation amount, and the implantation direction. Furthermore, the ion implantation condition information may include a combination of any items of the ion species, the acceleration energy, the implantation amount, and the implantation direction and another item. Alternatively, the ion implantation condition information may include one or more items other than the ion species, the acceleration energy, the implantation amount, and the implantation direction. Alternatively, the substrate information may be a combination of the hardened layer thickness information and the ion implantation condition information.

Note that the chemical liquid supply section 130 of the substrate processing apparatus 100 illustrated in FIG. 3 supplies the chemical liquid in a given state, which should not be taken to limit the present embodiment. The concentration and the temperature of the chemical liquid may be changed as appropriate.

Figure 17:
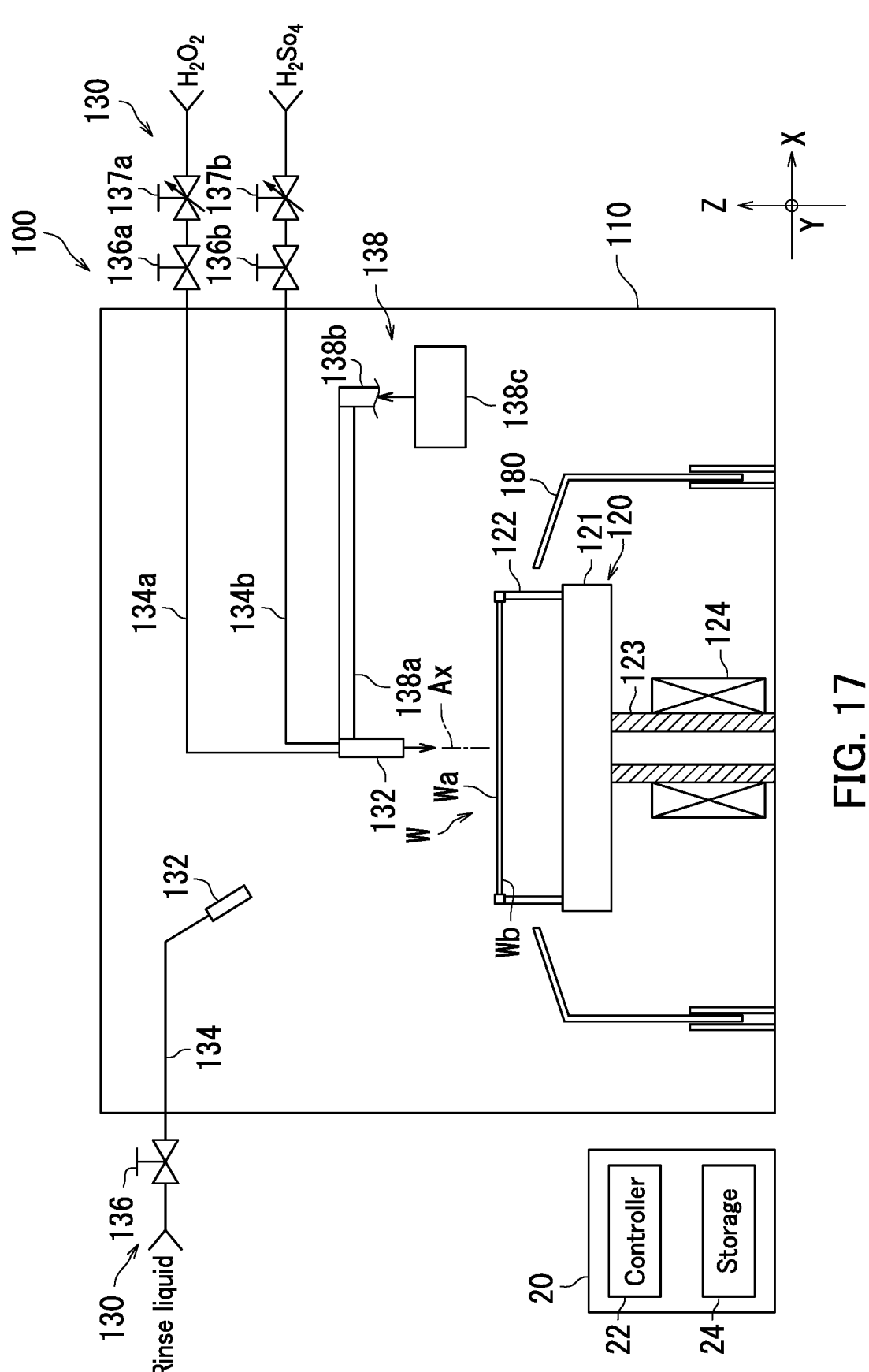
FIG. 17 is a schematic diagram of a substrate processing apparatus of the embodiment.

Next, a substrate processing apparatus 100 of the present embodiment will be described with reference to FIG. 17. FIG. 17 is a schematic diagram of the substrate processing apparatus 100 of the present embodiment. Note that the substrate processing apparatus 100 illustrated in FIG. 17 is the same as the substrate processing apparatus 100 described with reference to FIG. 3 in all aspects other than that the concentration and the temperature of the chemical liquid supplied from the chemical liquid supply section 130 is adjustable. Therefore, duplicate description is omitted for avoiding redundancy.

In the substrate processing apparatus 100 of the present embodiment illustrated in FIG. 17, the chemical liquid supply section 130 supplies an SPM as the chemical liquid to a substrate W. The SPM is produced by mixing sulfuric acid and hydrogen peroxide water. For example, the chemical liquid supply section 130 supplies the SPM to a substrate W with the concentration (mixing ratio) of the SPM changed. Thus, the substrate W is processed with the SPM.

The chemical liquid supply section 130 includes a nozzle 132, a pipe 134a, a valve 136a, an adjusting valve 137a, a pipe 134b, a valve 136b, and an adjusting valve 137b. The nozzle 132 is directed to an upper surface Wa of the substrate W and discharges the chemical liquid toward the upper surface Wa of the substrate W.

The pipe 134a is connected to the nozzle 132. The nozzle 132 is provided at the tip end of the pipe 134a. The hydrogen peroxide water is supplied to the pipe 134a from a supply source. The valve 136a and the adjusting valve 137a are provided in the pipe 134a. The valve 136a opens and closes the flow channel of the pipe 134a. The adjusting valve 137a adjusts the flow rate of the hydrogen peroxide water passing through the flow channel of the pipe 134a.

The pipe 134b is connected to the nozzle 132. The nozzle 132 is provided at the tip end of the pipe 134b. The sulfuric acid is supplied to the pipe 134b from a supply source. The temperature of the sulfuric acid may be the same as or different from the temperature of the hydrogen peroxide water. The valve 136b and the adjusting valve 137b are provided in the pipe 134b. The valve 136b opens and closes the flow channel of the pipe 134b. The adjusting valve 137b adjusts the flow rate of the sulfuric acid passing through the flow channel of the pipe 134b.

According to the present embodiment, adjustment of the adjusting valves 137a and 137b can change the flow rates of the hydrogen peroxide water and the sulfuric acid respectively flowing in the pipes 134a and 134b. Therefore, the concentration and the temperature of the SPM produced by mixing the hydrogen peroxide water and the sulfuric acid can be adjusted.

Note that where the resist layer R of the substrate W is to remove, the inner layer Ri is relatively easy to remove with the chemical liquid while the hardened layer Rc is relatively difficult to remove with the chemical liquid as described with reference to FIGS. 6 and 7. Therefore, it is preferable that the concentration of the SPM is controlled so as to increase the removing power of the SPM for removing the hardened layer Rc and controlled so as to reduce the removing power of the SPM for removing the inner layer Ri.

For example, the concentration of the SPM is controlled to increase the ratio of the hydrogen peroxide water in the SPM in removal of the hardened layer Rc and controlled to reduce the ratio of the hydrogen peroxide water in the SPM in removal of the inner layer Ri. This can remove the resist layer while suppressing damage to the resist layer R.

Figure 18:
FIG. 18 is a diagram of training data input to the training device of the embodiment.

The training data LD used in the training method of the present embodiment will be described next with reference to FIG. 18. FIG. 18 is a diagram indicating an example of the training data LD. The training data LD in FIG. 18 are favorably used for creating a trained model LM used in the substrate processing apparatus 100 illustrated in FIG. 17. Note that the training data LD in FIG. 18 is the same as the training data LD described with reference to FIG. 14 in all aspects other than that a value of at least one item of the training data indicates a profile of time variation in physical property. Therefore, duplicate description is omitted for avoiding redundancy.

As indicated in FIG. 18, the training data LD includes training data LD1 to LD1000. The chemical liquid processing condition includes the concentration profile of the chemical liquid, the temperature profile of the chemical liquid, the supply amount of the chemical liquid, the discharge pattern of the chemical liquid for each training target substrate, and the rotational speed of the training target substrate when the chemical liquid has been supplied. The concentration profile indicates change in concentration of the SPM over time. The temperature profile indicates change in temperature of the SPM having been used for the training target substrate WL over time. Furthermore, the supply amount indicates a supply amount of the SPM having been used for the training target substrate WL and the discharge pattern indicates a discharge pattern and discharge timing of the SPM for the training target substrate WL. In addition, the rotational speed indicates a rotational speed of the training target substrate WL when the SPM has been supplied to the training target substrate WL.

In the substrate processing apparatus 100 illustrated in FIG. 17, the ratio between the hydrogen peroxide water and the sulfuric acid in the SPM can be changed by the adjusting valves 137a and 137b. As such, in FIG. 18, the concentration of the chemical liquid indicates change in concentration of the chemical liquid having been used for the training target substrate WL over time and the temperature of the chemical liquid indicates change in temperature of the chemical liquid having been used for the training target substrate WL over time.

In the training data LD1, Lcp1 indicates a concentration profile of the SPM having been supplied to a training target substrate WL1 and Ltp1 indicates a temperature profile of the SPM having been supplied to the training target substrate WL1. Ls1 indicates a supply amount of the SPM having been supplied to the training target substrate WL1, and Le1 indicates a discharge pattern of the SPM for the training target substrate WL1. Furthermore, Lv1 indicates a rotational speed of the training target substrate WL when the SPM has been supplied to the training target substrate WL1.

The same applies to the training data LD2 to LD1000. The results of the chemical liquid processing on the training target substrates WL significantly vary depending on the concentration profiles and the temperature profiles of the training target substrates WL. Therefore, the training data LD preferably contains an item that greatly contributes to variation in results of the chemical liquid processing on the training target substrates WL.

Note that the storage 24 of each substrate processing apparatus 100 or the storage 424 of the training device 400 stores the trained model LM built through machine training in the above description made with reference to FIGS. 1 to 18, which should not be taken to limit the present embodiment. The storage 24 of each substrate processing apparatus 100 or the storage 424 of the training device 400 may store therein a conversion table CT in place of the trained model LM.

Next, a substrate processing apparatus 100 of the present embodiment will be described with reference to FIG. 19. The substrate processing apparatus 100 in FIG. 19 has the same configuration as the substrate processing apparatus 100 described with reference to FIG. 4 in all aspects other than that the storage 24 stores therein the conversion table CT in place of the trained model LM. Therefore, duplicate description is omitted for avoiding redundancy.

Figure 19:
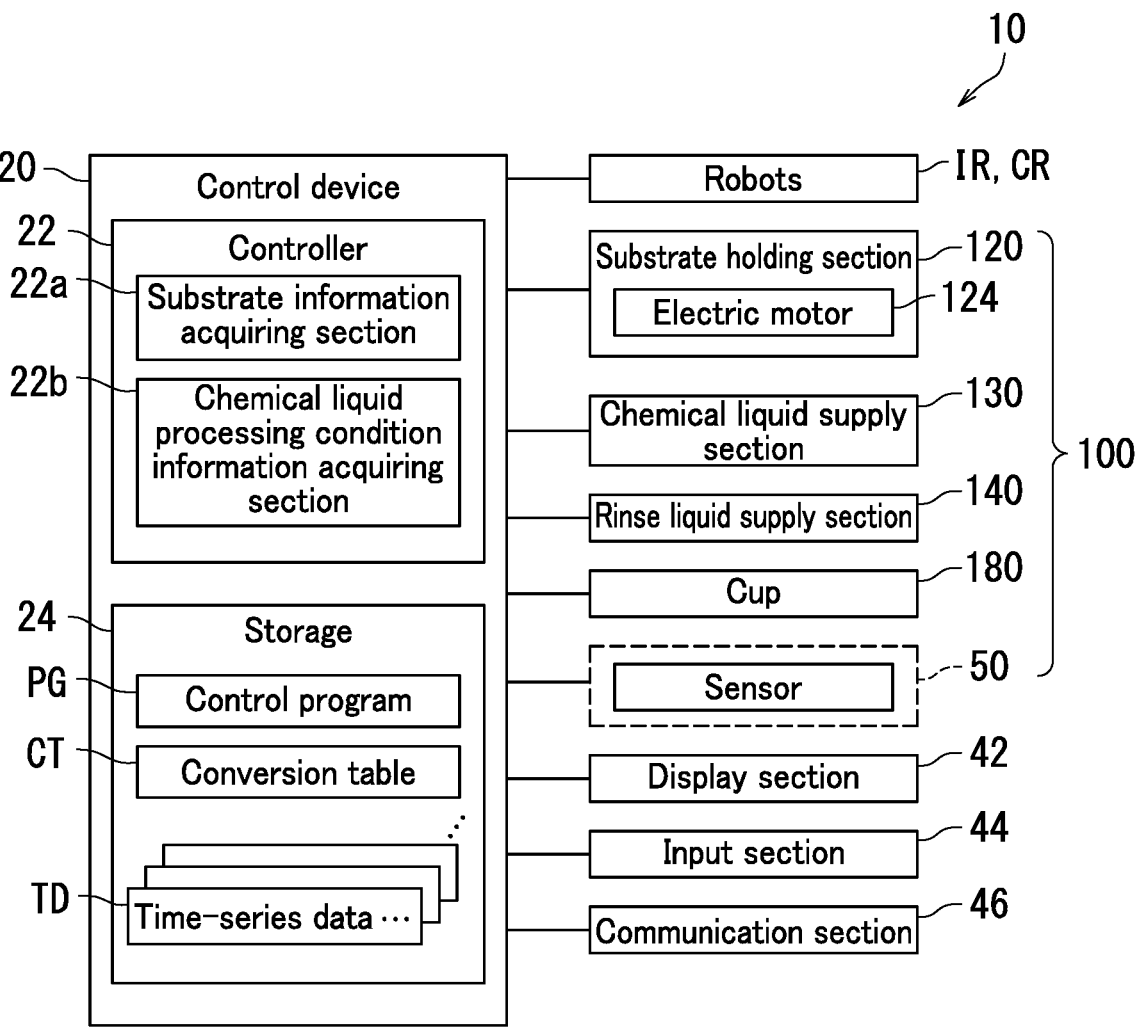
FIG. 19 is a block diagram of a substrate processing apparatus of the embodiment.

As illustrated in FIG. 19, the storage 24 of the substrate processing apparatus 100 stores the conversion table CT therein. In the conversion table CT, substrate information is associated with chemical liquid processing condition information for each processing target substrate Wp. The substrate information of the processing target substrates Wp contains hardened layer height information and hardened layer width information, for example. Note that the conversion table CT is created based on the substrate information, the chemical liquid processing condition information, and the processing result information of the training target substrate WL.

The substrate information acquiring section 22a acquires substrate information from the storage 24. For example, the substrate information acquiring section 22a acquires the hardened layer height information and the hardened layer width information from the storage 24.

The chemical liquid processing condition information acquiring section 22b acquires chemical liquid processing condition information based on the substrate information using the conversion table CT. Typically, the chemical liquid processing condition information acquiring section 22b extracts a value corresponding to the substrate information from the conversion table CT and acquires chemical liquid processing condition information based on the relationship between the substrate information and the chemical liquid processing condition information associated with each other in the conversion table CT. The chemical liquid processing condition information acquiring section 22b acquires the chemical liquid processing condition information corresponding to the substrate information using the conversion table CT in the manner described above.

Thereafter, the controller 22 controls the substrate holding section 120 and the chemical liquid supply section 130 according to the chemical liquid processing condition indicated in the chemical liquid processing condition information.

FIG. 20 is a diagram indicating an example of the conversion table CT. As indicated in FIG. 20, the conversion table CT indicates the substrate information of a processing target substrate Wp and the chemical liquid processing condition. In the conversion table CT, the substrate information contains information about the hardened layer. Here, the substrate information of the processing target substrate Wp contains hardened layer height information and hardened layer width information.

The conversion table CT1 indicates a chemical liquid processing condition corresponding to certain substrate information. Here, the substrate information contains hardened layer height information and the hardened layer width information of the processing target substrate Wp in the conversion table CT1. dt1 indicates a height of the hardened layer in the processing target substrate Wp. dw1 indicates a width of the hardened layer in the processing target substrate Wp. Rp1 indicates a chemical liquid processing condition for the chemical liquid processing to be performed on the processing target substrate Wp. As such, where the height of the hardened layer in the processing target substrate Wp is dt1 and the width of the hardened layer therein is dw1, the substrate processing apparatus 100 performs chemical liquid processing under the chemical liquid processing condition indicated by Rp1.

The same applies to the conversion tables CD2 to CD1000. Typically, at least one of the height of the hardened layer and the width of the hardened layer differs among the conversion tables CT1 to CD1000.

Note that when the height of the hardened layer in the processing target substrate Wp and the width of the hardened layer therein do not match any of the values indicated in the conversion table CT, a chemical liquid processing condition for the processing target substrate Wp may be determined by linear interpolation of the values of the chemical liquid processing condition indicated in the conversion table CT. Alternatively, a chemical liquid processing condition for the processing target substrate Wp may be determined by interpolation of values of the chemical liquid processing condition indicated in the conversion table using a polynomial equation.

An embodiment of the present invention has been described so far with reference to the drawings. However, the present invention is not limited to the above embodiment and can be implemented in various forms within a scope not departing from the gist thereof. Also, appropriate combination of some elements of configuration disclosed in the above embodiment can form various inventions. For example, some of all the elements of configuration indicated in the embodiment may be removed. Alternatively or additionally, elements of configuration in different embodiments may be combined as appropriate. The drawings schematically illustrate elements of configuration in order to facilitate understanding, and properties of elements of configuration illustrated in the drawings, such as thickness, length, number, and intervals thereof, may differ from actual properties thereof in order to facilitate preparation of the drawings. The properties of each of the elements of configuration, such as material, shape, and dimension thereof, described in the above embodiment are mere examples and not limited specifically, and various alterations thereof are possible within a range substantially not departing from the effects of the present invention.

INDUSTRIAL APPLICABILITY

The present invention is favorably used in a substrate processing apparatus, a substrate processing method, a training data generation method, a training method, a training device, a trained model creation method, and a trained model.

REFERENCE SIGNS LIST

10 Substrate processing system
20 Control device
22 Controller
22a Substrate information acquiring section
22b Chemical liquid processing condition information acquiring section
24 Storage
LM Trained model
100 Substrate processing apparatus
130 Chemical liquid supply section
140 Rinse liquid supply section
200 Substrate processing training system
300 Training data generating device
400 Training device

The invention claimed is:

1. A substrate processing apparatus comprising:
a substrate holding section configured to hold a processing target substrate in a rotatable manner, the processing target substrate including a resist layer with a hardened layer formed therein;
a chemical liquid supply section configured to supply a chemical liquid to remove the resist layer to the processing target substrate;
a substrate information acquiring section configured to acquire substrate information of the processing target substrate including hardened layer thickness information of the processing target substrate or ion implantation condition information of the processing target substrate, the hardened layer thickness information of the processing target substrate indicating a thickness of the hardened layer in the processing target substrate, the ion implantation condition information of the processing target substrate indicating a condition for ion implantation by which the hardened layer in the processing target substrate has been formed in the resist layer of the processing target substrate;
a chemical liquid processing condition information acquiring section configured to acquire chemical liquid processing condition information of the processing target substrate from a trained model based on the substrate information of the processing target substrate, the chemical liquid processing condition information of the processing target substrate indicating a chemical liquid processing condition to remove the resist layer from the processing target substrate; and
a controller configured to control the substrate holding section and the chemical liquid supply section to perform processing to remove the resist layer with a chemical liquid on the processing target substrate based on the chemical liquid processing condition information of the processing target substrate acquired in the chemical liquid processing condition information acquiring section, wherein
the trained model is built through machine training of training data in which substrate information of a training target substrate including a resist layer with a hardened layer formed therein, chemical liquid processing condition information of the training target substrate, and processing result information of the training target substrate are associated with each other, the substrate information of the training target substrate including hardened layer thickness information indicating a thickness of the hardened layer in the training target substrate or ion implantation condition information indicating a condition for ion implantation by which the hardened layer in the training target substrate has been formed in the resist layer of the training target substrate, the chemical liquid condition information of the training target substrate indicating a condition for the processing to remove the resist layer with the chemical liquid having been performed on the training target substrate, the processing result information indicating a result of the processing with the chemical liquid having been on the training target substrate,
the chemical liquid processing condition information of the processing target substrate contains information indicating any of a concentration of the chemical liquid, a temperature of the chemical liquid, a supply amount of the chemical liquid, a discharge pattern of the chemical liquid, and a rotational speed of the processing target substrate in supply of the chemical liquid, and
the chemical liquid processing condition information of the training target substrate contains information indicating any of the concentration of the chemical liquid, the temperature of the chemical liquid, the supply amount of the chemical liquid, the discharge pattern of the chemical liquid, and a rotational speed of the training target substrate when the chemical liquid has been supplied.

2. The substrate processing apparatus according to claim 1, further comprising:
storage that stores the trained model therein.

3. The substrate processing apparatus according to claim 1, wherein
the hardened layer thickness information of the processing target substrate contains hardened layer height information indicating a height of the hardened layer in the processing target substrate or hardened layer width information indicating a width of the hardened layer in the processing target substrate, and the hardened layer thickness information of the training target substrate contains hardened layer height information indicating a height of the hardened layer in the training target substrate or hardened layer width information indicating a width of the hardened layer in the training target substrate.

4. The substrate processing apparatus according to claim 1, wherein the information indicating the concentration of the chemical liquid of the processing target substrate indicates a concentration profile in which the concentration of the chemical liquid changes over time, and the information indicating the concentration of the chemical liquid of the training target substrate indicates a concentration profile in which the concentration of the chemical liquid has changed over time.

5. The substrate processing apparatus according to claim 4, wherein the chemical liquid supply section includes a nozzle to supply an SPM (Sulfuric acid hydrogen Peroxide Mixture) as the chemical liquid to the processing target substrate, and a mixing ratio changer to change a mixing ratio of sulfuric acid and hydrogen peroxide in the SPM, and the controller is configured to control the mixing ratio changer according to the concentration profile.

6. The substrate processing apparatus according to claim 1, wherein the information indicating the temperature of the chemical liquid of the processing target substrate indicates a temperature profile in which the temperature of the chemical liquid changes over time, and the information indicating the temperature of the chemical liquid of the training target substrate indicates a temperature profile in which the temperature of the chemical liquid has changed over time.

7. The substrate processing apparatus according to claim 6, wherein the chemical liquid supply section includes a nozzle to supply an SPM (Sulfuric acid hydrogen Peroxide Mixture) as the chemical liquid to the processing target substrate, and a mixing ratio changer to change a mixing ratio of sulfuric acid and hydrogen peroxide in the SPM, and the controller is configured to control the mixing ratio changer according to the temperature profile.

8. A substrate processing method performed by the substrate processing apparatus according to claim 1, the method comprising:

holding a processing target substrate in a rotatable manner, the processing target substrate including a resist layer with a hardened layer formed therein;

acquiring substrate information of the processing target substrate containing hardened layer thickness information of the processing target substrate or ion implantation condition information of the processing target substrate, the hardened layer thickness information of the processing target substrate indicating a thickness of the hardened layer in the processing target substrate, the ion implantation condition information of the processing target substrate indicating a condition for ion implantation by which the hardened layer in the processing target substrate has been formed in the resist layer of the processing target substrate;

acquiring chemical liquid processing condition information of the processing target substrate from a trained model based on the substrate information of the processing target substrate, the chemical liquid processing condition information of the processing target substrate indicating a chemical liquid processing condition to remove the resist layer from the processing target substrate; and performing processing to remove the resist layer with a chemical liquid on the processing target substrate according to the chemical liquid processing condition indicated in the chemical liquid processing condition information of the processing target substrate, wherein in the acquiring chemical liquid processing condition information of the processing target substrate, the trained model is built through machine training of training data in which substrate information of a training target substrate including a resist layer with a hardened layer formed therein, chemical liquid processing condition information of the training target substrate, and processing result information of the training target substrate are associated with each other, the substrate information of the training target substrate including hardened layer thickness information indicating a thickness of the hardened layer in the training target substrate or ion implantation condition information indicating a condition for ion implantation by which the hardened layer in the training target substrate has been formed in the resist layer of the training target substrate, the chemical liquid condition information of the training target substrate indicating a condition for the processing to remove the resist layer with the chemical liquid having been performed on the training target substrate, the processing result information indicating a result of the processing with the chemical liquid having been on the training target substrate.

* * * * *